United States Patent
Yamasaki et al.

[11] Patent Number: 6,080,936
[45] Date of Patent: Jun. 27, 2000

[54] CONNECTING BOARD WITH OVAL-SHAPED PROTRUSIONS

[75] Inventors: Kozo Yamasaki, Gifu; Hajime Saiki, Aichi, both of Japan

[73] Assignee: NGK Spark Plug Co., Ltd., Nagoya, Japan

[21] Appl. No.: 08/840,658

[22] Filed: Apr. 25, 1997

[30] Foreign Application Priority Data

Apr. 26, 1996 [JP] Japan ................................ 8-130658
Mar. 13, 1997 [JP] Japan ................................ 9-082123

[51] Int. Cl.⁷ ......................................... H01R 9/09
[52] U.S. Cl. ...................... 174/263; 174/264; 174/260; 439/91; 228/180.21; 361/768
[58] Field of Search .................... 174/265, 264, 174/267, 261, 262, 263, 260; 361/803, 804, 790, 767, 768, 770, 792, 794, 795; 439/91, 591; 228/180.21, 180.22

[56] References Cited

U.S. PATENT DOCUMENTS

| | | | |
|---|---|---|---|
| 4,830,264 | 5/1989 | Bitaillou et al. | 228/180.2 |
| 4,914,814 | 4/1990 | Behun et al. | 29/843 |
| 5,060,844 | 10/1991 | Behun et al. | 228/180.21 |
| 5,071,359 | 12/1991 | Arnio et al. | 439/91 |
| 5,174,766 | 12/1992 | Yoshizawa et al. | 439/91 |
| 5,340,947 | 8/1994 | Credle et al. | 174/262 |
| 5,456,004 | 10/1995 | Swamy | 29/852 |
| 5,509,203 | 4/1996 | Yamashita | 29/879 |
| 5,512,786 | 4/1996 | Imamura et al. | 257/780 |
| 5,531,021 | 7/1996 | Kolman et al. | 29/843 |
| 5,624,268 | 4/1997 | Maeda et al. | 439/66 |
| 5,656,798 | 8/1997 | Kubo et al. | 174/265 |

FOREIGN PATENT DOCUMENTS

| | | |
|---|---|---|
| 0 150 928 | 8/1985 | European Pat. Off. |
| 0 433 996 | 6/1991 | European Pat. Off. |
| 59-996 | 1/1984 | Japan. |
| 60-123093 | 7/1985 | Japan. |
| 2-81447 | 3/1990 | Japan. |
| 5-29390 | 2/1993 | Japan. |
| 5-50876 | 7/1993 | Japan. |
| 6-291165 | 10/1994 | Japan. |
| 7-161866 | 6/1995 | Japan. |
| 7-273438 | 10/1995 | Japan. |
| 8-55930 | 2/1996 | Japan. |
| 2 142 568 | 1/1985 | United Kingdom. |

OTHER PUBLICATIONS

Patent Abstracts of Japan, vol. 18, No. 673, (E–1647), Dec. 19, 1994.
Patent Abstracts of Japan, vol. 15, No. 453, (E–1134), Nov. 18, 1991.
Patent Abstracts of Japan, vol. 7, No. 115, (E–176), May 19, 1983.
Patent Abstracts of Japan, vol. 17, No. 625, (E–1461), Nov. 18, 1993.

*Primary Examiner*—Kristine Kincaid
*Assistant Examiner*—Kamand Cuneo
*Attorney, Agent, or Firm*—Foley & Lardner

[57] ABSTRACT

A connecting board is provided for disposition between a base plate such as a LGA base plate and a mounting board such as a printed circuit board. The connecting board has a substrate having a plurality of through holes. Each through hole extends between opposite first and second surfaces of the substrate and includes connecting portions having a continuous oval shape. An easily deformable soft metal body is mounted in each through hole in such a way as to have protruded portions protruding from the first and second surfaces of the substrate. The protruded portions of the soft metal body are different in protruding height. The connecting board are connected at the protruded portions to the base plate and the mounting board. The heights of the protruded portions are set depending upon the materials and the coefficients of thermal expansion of the LGA base plate, printed circuit board and connecting board. By making the protruding heights of the protruded portions different from each other, the distance between the LGA base plate and the connecting board and the distance between the connecting board and the printed circuit board are set desiredly.

4 Claims, 17 Drawing Sheets

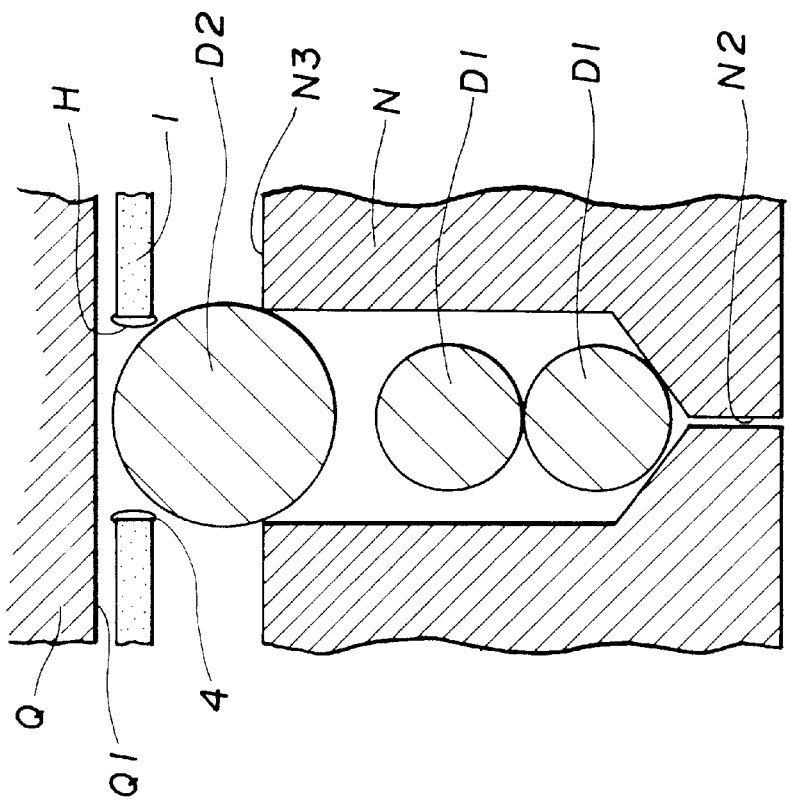
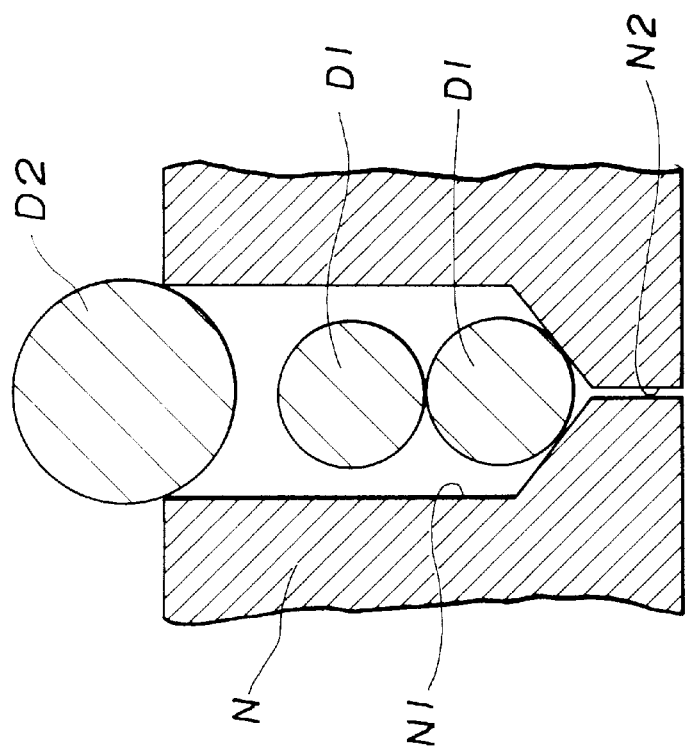
FIG.14A
FIG.14B

CONNECTING BOARD WITH OVAL-SHAPED PROTRUSIONS

BACKGROUND OF THE INVENTION

1. Field of the Invention

The present invention relates to a connecting board disposed between a base plate such as a BGA type integrated circuit package base having surface-bonding terminals and a mounting board such as a mother board to which the base plate is bonded. The present invention further relates to a method of making such a connecting board. The present invention still further relates to an assembly of a base plate, a connecting board and a mounting board, and a subassembly of a base plate and a connecting board.

2. Description of the Prior Art

As the integrated circuit technology has been developed recently, the number of the input/output terminals provided to IC chips has also increased, and this has increased the number of the input/output terminals formed on an IC-mounted base plate on which the IC chips are mounted. However, it is not desired that the input/output terminals be formed on the peripheral portion of the base plate because the size of the base plate is enlarged as the number of the terminals increases whereby the cost of the IC-mounted base plates is elevated and their yield is lowered.

There has been widely used a so-called PGA (pin grid array) type base plate in which pins are arranged so as to form a grid pattern or a checkered pattern on the main surface (the main plane) of the IC-mounted base plate. However, the PGA type base plate has limitation when the number of the terminals is increased more and its size is decreased more.

The next method has been adopted to improve this situation. In place of the pins, pads (or lands) are arranged so as to form a grid pattern or a checkered pattern on the surface of the base plate, and bumps, to which terminal members made of substantially ball-like high temperature solder or a metal such as copper or silver having good solder wettablility is eutectically soldered, are formed on the pads. Other pads are formed on the portions of the related printed circuit board (PCB)such as a mother board at the positions corresponding to the pads of the IC-mounted base plate, and eutectic solder paste is applied to the pads of the printed circuit board. Thereafter, both the base plate and the printed circuit board are piled up and heated to melt the solder paste. In this way, the base plate and the printed circuit board are bonded together by solder through the terminal members. In general, a base plate which is provided with only pads arranged so as to form a grid pattern is called an LGA (land grid array) type base plate and a base plate which is provided with ball-shaped terminal members on the pads is called a BGA (ball grid array) type base plate.

When terminals such as pads or bumps are formed so as to constitute a grid pattern (including a checkered pattern) on the planar surface of an IC-mounted base plate and/or a printed circuit board and the IC-mounted base plate is bonded to the printed circuit board (hereinafter such bonding being referred to as the "surface bonding"), difference in thermal expansion occurs between the IC-mounted base plate and the printed circuit board along the planar surface because the coefficients of thermal expansion of the IC-mounted base plate and the printed circuit board due to the difference in their materials. In other words, the IC-mounted base plate and the printed circuit board which are bonded together tend to deform in the same directions along the planar surface but by a different amount from each other so that shearing stress is exerted on the terminal members and the pads.

The shearing stress becomes maximum between the two terminals which are disposed remotest from each other when the magnitude of the shearing stress is taken into account between any two surface-bonded terminals. More specifically, in case the terminals are arranged so as to form a grid pattern and the outermost terminals form a square, the largest difference in thermal expansion occurs between the outermost terminals at each pair of diagonal corners of the square, and the largest shearing stress is exerted on each pair of the outermost terminals. Upon bonding a board such as an LGA type base plate or a BGA type base plate to a printed circuit board in particular, the interval (pitch) between the terminals is relatively large, tending to make the distance between the most separated terminals large. Particularly, when an LGA type or BGA type base plate is made of ceramic, the base plate has a smaller coefficient of thermal expansion than a printed circuit board generally made of glass epoxy resin, and thus the board is applied with a larger shearing stress.

When such shearing stress is applied to the IC-mounted base plate in case the adhering strength (bonding strength) between the pads formed on the IC-mounted base plate and the solder is not so large, bonding between the board and the solder is sometimes broken. I.e., the solder as well as the terminal members are sometimes removed from the pads. Thus, it is desired to make the adhering strength large enough.

When, however, the adhering strength between the pads and the solder is increased, cracks extending substantially in parallel with pads are produced in the solder in the vicinity of the related pads due to repeated thermal stress, and, finally, the solder is broken. Thus, it is impossible to attain high bonding reliability. Since the solder in the vicinity of the pads is generally of a eutectic type, it is relatively hard and brittle and a secular change in the solder occurs easily due to heat and stress. Owing to this nature, cracks are produced in the solder when repeated stress is applied.

This problem is likely to be arisen between an LGA type base plate (or a BGA type base plate) made of ceramic which has a relative low coefficient of thermal expansion and a printed circuit board made of resin such as glass epoxy resin which has a relatively high coefficient of thermal expansion. In most cases, cracks are produced eutectic solder portions in the vicinity of the pads formed on the ceramic base plate, because the base plate made of ceramic is hard and does not absorb stress whereas the printed circuit board made of resin and the pads made of copper or the like are relatively soft and absorb the stress.

Japanese patent application provisional publication No. 8-55930 discloses a package for housing a semiconductor, having pads disposed on the bottom of a depression formed in the lower surface of an insulating substrate and ball-shaped terminal members having a predetermined dimensional relation to the pads and soldered to the pads. In this arrangement, the ball-shaped terminals are brazed to the pads accurately and securely.

In the package of this prior art, however, the depression must be formed in the insulated base plate (IC-mounted base plate) and pads must be provided on the bottoms of the depression, leading to a complicated structure. This makes it difficult to fabricate the package and elevates its manufacturing cost. It is also difficult to insert a blazing material in the depression and to blaze the ball-shaped terminals to the pads.

The LGA type base plate is bonded to the printed circuit board in the following cumbersome steps. Ball-shaped terminal members made of solder having a high melting point or copper are temporarily fixed to the lands (pads) of the LGA type base plate by means of solder paste such eutectic solder paste having a lower melting point than the terminal members. Then, reflow is conducted to solder the terminal members to the pads and a BGA type base plate is fabricated. Here, the solder having a low melting point and the solder having a high melting point are hereinafter referred to as the "low temperature solder" and the "high temperature solder", respectively. After low temperature solder paste has been applied to the pads on the printed circuit board, the BGA type base plate is mounted on the printed circuit board and the terminal members are aligned with the pads on the printed circuit board. Thereafter, reflowing is performed again to solder the terminal members to the pads on the printed circuit board.

After having purchased LGA type base plates on which IC chips are to be mounted, having mounted the IC chips on the base plates and having performed flip chip bonding, IC chip makers or manufacturers must bond the terminal members to the pads (lands) of the base plates by means of low temperature solder (for example, eutectic solder) which has a melting point lower than the solder (for example, high temperature solder) used for the flip chip bonding. In addition to the equipment or apparatus for flip-chip bonding the IC chips to the base plates, there are required apparatuses for fabricating a BGA type base plate from an LGA type base plate, i.e., apparatuses for bonding the terminal members to pads, such as an apparatus for applying solder paste (for example, eutectic solder paste) to the pads and an apparatus for mounting the terminal members on the pads.

SUMMARY OF THE INVENTION

According to an aspect of the present invention, there is provided a connecting board to be disposed between a base plate having a plurality of surface-bonding pads and a mounting board having a plurality of surface-bonding and mounting pads at the corresponding positions to the surface-bonding pads of the base plate, for connection of the base plate and the mounting board through connection at the surface-bonding pads on a first surface side of the connecting board and at the surface-bonding and mounting pads on a second surface side of the connecting board. The connecting board comprises a substrate in the form of flat plate, having said first surface and said second surface and a plurality of through holes extending between the first and second surfaces, and a plurality of soft metal bodies mounted in the through holes, respectively, each of the soft metal bodies having at least one of a first protruded portion protruding from the first surface so as to have a first protruding height Z1 and a second protruded portion protruding from the second surface so as to have a second protruding height Z2, the first protruding height Z1 and the second protruding height Z2 being different from each other.

In other words, the protruding height Z1 of the first protruded portion is unequal to the protruding height Z2 of the second protruded portion.

The base plate is, for example, a base plate such as an IC-mounted base plate on which IC chips and other electronic parts are mounted. The surface-bonding pad is a terminal formed on a base plate for electrically connecting the base plate to a mounting board by means of surface bonding. The surface bonding is a bonding technology in which terminals such as pads or bumps are arranged so as to form a linear pattern or in a grid pattern (including a checkered pattern) on the planar surface of a chip, a base plate or a mother board. A rectangular frame shape is an example of the linear pattern. A base plate having surface-bonding pads may be an LGA type base plate having pads (lands) arranged so as to form a grid pattern but may be a base plate having pads arranged in another manner.

The mounting board is a board used for mounting thereon or attaching thereto the above described base plate, and a printed circuit board such as a motherboard is an example of the mounting board. Surface-bonding and mounting pads are terminals for electrically connecting the base plate to the mounting board and formed on the mounting board by means of surface bonding. The mounting board having surface-bonding and mounting pads may be a printed circuit board having pads arranged so as to form a grid pattern but it is not limited thereto. It may have a plurality of groups of surface-bonding and mounting pads arranged so as to correspond to a plurality of base plates which are to be bonded thereto.

The connecting board according to the present invention is disposed between the base plate and the mounting board and is bonded or connected to them. The surface of the connecting board which is bonded to the base plate is called the "first surface" and the other surface which is bonded to the mounting board is called the "second surface" in order that they are distinguished from each other for convenience.

Each through hole formed in the connecting board is generally a single hole but may consist of a bundle of small hole portions. In the latter case, soft metal portions inserted in the small hole portions are connected together to form a soft metal body.

The soft metal bodies are made of soft metal which is deformed to absorb stress produced between the base plate and the mounting board, between the base plate and the connecting board substrate and/or between the connecting board substrate and the mounting board due to the difference in their coefficients of thermal expansion. The concrete material of the soft metal bodies is lead (Pb), tin (Sn), zinc (Zn), alloys containing some of these materials as main elements, Pb—Sn base high temperature solder (for example, an alloy consisting of 90% of Pb and 10% of Sn or an alloy consisting of 95% of Pb and 5% of Sn), white metal or the like. Since plastic deformation of a body made of lead, tin or the like is not attended with stress but heat, it is convenient to use these materials because they are hardly broken even if repeated stress is applied thereto. Other material such as highly pure copper (Cu) or silver (Ag) can be used because they are soft.

The protruding height is defined as a height from the related surface of the connecting board substrate to the tip of the soft metal bodies. When the tip of the soft body is flush with the surface of the connecting board substrate or recessed therefrom, the protruding height is defined as being zero. In other words, the first protruding height Z1 is defined as the height from the first surface of the connecting board to the tip of the soft material body which protrudes therefrom, and the second protruding height Z2 is defined as the height from the second surface of the connecting board to the tip of the soft material body which protrudes therefrom.

Solder having a melting point lower than the soft metal body may be used for bonding between the connecting board, the base plate and the mounting board, i.e., for the bonding between the soft metal bodies, the surface-bonding pads and the surface-bonding and mounting pads. Upon using such solder, it is preferred that the melting point of the soft material body be different from that of the solder. For example, when high temperature solder consisting of 90% of Pb and 10% of Sn and having a melting point of 301° C. is used as soft metal bodies, there may be used eutectic solder consisting of 36% of Pb and 64% of Sn having a melting point of 183° C. or an alloy consisting of 20% to 80% of Pb and 80% to 20% of Sn or the like. Further, other chemical elements such In, Ag, Bi, and/or Sb may be added to the solder or the alloy.

This aspect of the invention relates to an connecting board which is bonded to a base plate at the first surface and to a mounting board at the second surface.

By this aspect, soft metal bodies extending through the connecting board is deformed (for example, deformed plastically) to absorb the stress produced between the base plate and the mounting board, between the base plate and the connecting board or between the connecting board and the mounting board due to the difference in the coefficients of the thermal expansion of these boards. Therefore, the soft metal body is not broken. Further, the surface-bonding pads on the base plate and/or the surface-bonding and mounting pads on the mounting board (both pads being hereinafter simply referred to as the "pads"), or the solder or portions of the soft metal bodies which are disposed in the vicinity of the pads are not damaged or broken due to the stress. Further, since the stress is exerted from the soft metal body on the connecting board perpendicularly to the peripheral surfaces of the through holes, the connecting board itself is hardly broken.

As the soft metal bodies are provided with the protruded portions on at least one of its first and second surfaces, the soft metal bodies can absorb, at the protruded portions, much stress which is produced between the base plate or the mounting board and the connecting board. The protruded portions can be deformed without being restricted by the through holes in the connecting board. Thus, the protruded portions are deformed more easily so as to absorb more stress. Since parts of the soft metal bodies which are inserted in the through holes in the connecting board form protruded portions, the stress applied to the portions of the soft metal body which intersect the first surface and/or the second surface of the soft metal bodies (i.e., the roots of the protruded portions) and the vicinity thereof is reduced by the deformation of the soft metal body whereby no cracks are produced in the protruded portions.

In case where the soft metal body has protruded portions extending from both the first and second surfaces of the connecting board, the height $Z_1$ of the protruded portions on the first surface side is unequal to the height $Z_2$ of the protruded portions on the second surface. When the base plate is bonded or connected to the mounting board with the connecting board interposed therebetween, the space (distance) between the base plate and the connecting board substrate can be made unequal to the space (distance) between the mounting board and the connecting board substrate. The more these spaces, the more the stress is absorbed. In general, the space between the base plate and the connecting board substrate is limited. According to this arrangement, suitable spaces can be selected in consideration of the coefficients of thermal expansion of the base plate and the mounting board and the strength of the pads and the like.

According to another aspect of the present invention, the second protruding height $Z_2$ is larger than the first protruding height $Z_1$. In other words, $Z_1<Z_2$.

Upon bonding the base plate to the mounting board, this unequal arrangement of the protruded portions can make the spaces between the base plate and the connecting board larger than the space between the connecting board and the mounting board so that the stress produced between the connecting board and the mounting board due to the difference in the coefficients of thermal expansion between both boards can be absorbed more. In consequence, the surface-bonding mounting pads, the solder disposed in the vicinity thereof and/or the soft metal bodies are not damaged or broken due to the stress.

According to a further aspect of the present invention, there is provided an connecting board as defined by the second aspect of the present invention, the first protruded portion protrudes little from the first surface of the connecting board substrate. In other words, $Z_2>Z_1 \approx 0$.

In this arrangement, the second protruded portions project from the second surface of the connecting board whereas the first protruded portions protrude little from the first surface of the connecting board. In this case, a space (distance) substantially equal to the thickness of the solder is provided between the base plate and the connecting board on the first surface side of the connecting board, whereas the connecting board is bonded or connected to the mounting board on the second surface side at a space corresponding to at least the height of the second protruded portions. That is, the space between the base plate and the connecting board on the first surface side at which the protruded portions protrude little can be made small enough, whereas the space between the connecting board and the mounting board on the second surface side at which the second protruded portions protrude can be made large. In this connection, the stress due to the difference between the coefficients of thermal expansion on the second surface side, i.e., the difference between the coefficients of thermal expansion of the connecting board and the mounting board can be absorbed enough. In this way, the stress between the connecting board (connecting board substratre) and the mounting board can be reduced most. Thus, the bonding solder on the second surface side in the vicinity of the surface-bonding and mounting pads and/or the soft metal bodies are not broken.

The portion of the soft metal bodies on the first surface side may be made flush with the first surface or may be depressed therefrom.

According to a further aspect of the present invention, the base plate is made of ceramic and the connecting board is made of substantially the same ceramic as the base plate.

Since the base plate and the connecting board are made of substantially the same ceramic in this arrangement, there is little difference in the coefficients of thermal expansion between them and thus little stress is produced. The space between the connecting board substrate and the mounting board is made relatively large by means of the second protruded portions, whereby the stress between the both boards is reduced. In other words, the stress in the base plate and the mounting board is small. Thus, when these three devices are bonded or connected together, an assembly having high reliability and a long life can be obtained.

As the ceramic for the base plate, alumina is widely used, but other material such as mullite, aluminum nitride or glass ceramic can be employed in consideration of easiness of manufacture, the coefficients of thermal conductivity and the coefficients of thermal expansion. The ceramic used for the connecting board substrate may be substantially the same material as that used for the base plate, such as alumina, mullite, aluminum nitride or glass ceramic.

The connecting board substrate made of ceramic has large mechanical strength and a good heat resistance. This structure is preferable because the connecting board is not deformed even if it is heated repeatedly during the reworking processes.

According to a further aspect of the present invention, the first protruding height Z1 is larger than the second protruding height Z2. That is, Z1>Z2.

Upon bonding the base plate to the connecting board in this arrangement, the space between the base plate and the mounting board can be made larger than the space between the connecting board and the mounting board, and the stress produced between the base plate and the connecting board due to the difference in the coefficients of thermal expansion can be absorbed more. Thus, the soft metal bodies, the surface-bonding pads on the base plate and the solder disposed in the vicinity of the pads are not damaged or broken due to the stress.

According to a further aspect of the present invention, the second protruded portion protrude little from the second surface of the connecting board. That is, Z1>Z2≈0.

The soft metal body has the first protruded portions. Thus, the space between the base plate and the connecting board is at least equal to the height of the first protruded portions. On the other hand, the soft metal bodies hardly protrude or protrude little from the second surface. Thus, the connecting board and the mounting board are bonded or connected together at a space substantially equivalent to the thickness of the solder. In this structure, therefore, the space between the connecting board body and the mounting board is small enough on the second surface side at which the protruded portions hardly protrude or protrude little while the space between the base plate and the connecting board can be made large on the first surface side. This structure allows for full absorption of the stress due to the difference in the coefficients of thermal expansion on the first surface side, i.e., due to the difference in the coefficients of thermal expansion between the base plate and the connecting board. In this way, the stress produced between the base plate and the connecting board (connecting board substrate) can be reduced most. Thus, the surface-bonding pads on the base plate, the bonding solder disposed in the vicinity of the pads on the first surface side and/or the soft metal bodies are not broken.

The portions of the soft metal bodies on the second surface side at which the protruded portions do not protrude may be made flush with the second surface of the connecting board or may be depressed from the second surface.

According to a further aspect of the present invention, a coefficient of thermal expansion of the connecting board substrate is intermediate between those of the base plate and the mounting board.

The intermediate value of the coefficient of thermal expansion enables the stress due to the difference in the coefficients of thermal expansion to be reduced.

According to a further aspect of the present invention, higher one of the first and second protruded portions is shaped like post and has a height larger than a maximum diameter thereof.

When the protruding height is made high to enlarge the space between the base plate or the mounting board and the connecting board in case the protruded portions has a substantially spherical shape or a substantially semispherical shape, the maximum diameter of the protruded portions increases. Thus, the maximum diameter of the protruded portions is limited by the space (pitch) between the base plate or the mounting board and the soft metal bodies. With the structure according to this aspect of the present invention, however, there is not such limitation, and thus the space or distance between the base plate and the mounting board can be larger on the surface side where higher protruded portions are provided. Further, the protruded portions can be made relatively small in diameter so as to be deformed easily. Thus, much more stress can be absorbed.

According to a further aspect of the present invention, a metal layer is formed on an inner peripheral surface of each of the through holes, and each of the soft metal bodies is welded onto the metal layer.

By welding the soft metal bodies onto the respective metal layers, the soft metal bodies can be formed integral with the connecting board substrate. This structure prevents the soft metal bodies from dropping off from the through holes and being displaced axially thereof.

The material and the metallizing method of the metal layer can be suitably selected in consideration of the material of the connecting board substrate and the size of the through hole and the material of the soft metal body which is to be welded onto the metal layer.

For the connecting board substrate made of ceramic, the metal layer can be formed in the following way. After through holes have been formed in a green ceramic plate, metal paste is applied to the inner wall surfaces of the through holes and then is sintered together with the green ceramic plate. Alternately, after the green ceramic plate has been sintered, the metal paste is applied to the inner peripheral surfaces of the through holes and then sintered. The metal used in the metal paste may be W, Mo, Mo—Mn, Ag, Ag—Pd, Cu or the like. In order to improve the welding ability and to prevent oxidization and the like, Ni, Au or the like can plated on the metal layer.

The metal layer may be formed by vapor deposition or spattering. Further, Cu plating, Ni plating, or Au plating or the like can be made to form a plated layer thereon. Otherwise, the metal layer may be directly formed on the inner peripheral surfaces of the through holes by means of electroless plating such as electroless Cu plating or electroless Ni plating. A Au-plated layer may be further formed thereon.

The connecting board may not be formed with a metal layer in order to reduce the cost. When this is the case, the soft metal bodies are not fixed to the through holes in the connecting board, so it is preferred that the protruded portions on at least one of the first and the second surface sides have a larger diameter than that of the through holes in order to prevent the soft metal bodies from being removed or dropped from the through holes.

According to a further aspect of the present invention, there is further provided a mark for identifying the first and second surfaces of the connecting board.

Provision of the marks prevents erroneous selection of the first and second surfaces when the connecting board is bonded or connected to the base plate or mounting the base plate, or when the base plate, the connecting board and the mounting board are bonded together. Generally, the pads are arranged so as to form a grid pattern or a checkered pattern on the base plate and the like. The soft metal bodies are arranged in the same way on the connecting board. Thus, it is often difficult to select either one of the first and second surfaces of the connecting board if no mark is provided.

When, for example, the first surface is mistakenly chosen and the bonding is carried out, the predetermined space between the base plate and the connecting board cannot be obtained, and, therefore, there is a possibility that the reliability on the joining portions becomes lower than expected. By providing the marks on the connecting board, such a mistake can be prevented, and a high reliability can be obtained in the bonding of the connecting board, the base and the mounting board.

As the mark is provided also on the connecting board substrate, recognition of the surface to be selected becomes easy. The mark can be recognized after heating for the bonding.

The mark may be provided either one of the first and second surfaces but the marks may be formed on both surfaces. The mark may be a distinguishable letter, sign or the like formed on a suitable portion of the connecting board by ink printing, ceramic baking, glass baking, metallized-ink baking or the like. The mark may be a notch or a through hole formed in the connecting board substrates.

According to a further aspect of the present invention, the mark is provided so as to be observable from the second surface side.

The reason why the mark is provided so as to be observable at or from the second surface side is as follows.

In many cases, the base plate is bonded to the connecting board to constitute a subassembly first, and then the subassembly is bonded to the mounting board. Since the soft metal bodies look like terminals (bumps), the subassembly is treated as a BGA type base plate or an LGA base plate. When, therefore, the mark is observed at or from the second surface side, the correct bonding between the base plate and the connecting board can be affirmed before bonding of the base plate to the connecting board.

In order that the mark can be observed at the second surface side, the mark is formed on the second surface. A notch, a through hole or the like may be formed as a mark in the connecting board so that the mark can be observed at the second surface side.

The mark may be provided so as to be observable from the first surface side.

There are some cases in which, in order to bonding together the connecting board, the base plate and the mounting board, the connecting board is bonded to the mounting board to constitute a subassembly first and then the subassembly is bonded to the base plate. When the mark is provided so as to be observable at or from the first surface side, it can be confirmed that the connecting board is correctly bonded to the mounting board before the base plate is bonded to the subassembly.

As a mark, a notch, a through hole or the like may be formed in the connecting board substrate.

According to a further aspect of the present invention, there is provided an assembly of a base plate having a plurality of surface-bonding pads and a first coefficient of thermal expansion α1, a mounting board having a plurality of surface-bonding and mounting pads at corresponding positions to the surface-boding pads and a second coefficient of thermal expansion α2 and an connecting board interposed between said base plate and said mounting board, wherein the connecting board comprises a nearly rectangular substrate having a first surface, a second surface, a plurality of through holes extending between the first and second surfaces and having a third coefficient of thermal expansion αm, and a plurality of soft metal bodies mounted in the through holes, respectively, each of the soft metal bodies having at least one of a first protruded portion protruding from the first surface and a second protruded portion protruding from the second surface, wherein the base plate and the connecting board are connected at a distance A1 on the first surface side by connecting the first protruded portion to the surface-bonding pads with solder which is lower in melting point than the soft metal bodies, wherein the connecting board and the mounting board are connected together at a distance A2 on the second surface side by connecting the second protruded portion to the surface-bonding and mounting pads with solder which is lower in melting point than the soft metal bodies, and wherein the first distance A1 is made larger than the second distance A2 if the difference between the first coefficient of thermal expansion α1 and the third coefficient of thermal expansion αm is larger than the difference between the second coefficient of thermal expansion α2 and the third coefficient of thermal expansion αm, and the second distance A2 is made larger than the first distance A1 if the difference between the second coefficient of thermal expansion α2 and the third coefficient of thermal expansion αm is larger than the difference between the first coefficient of thermal expansion α1 and the third coefficient of thermal expansion αm.

In other words, it is selected that A1>A2 if |α1−αm|>|α2−αm|, and A1<A2 if |α1−αm|<|α2−αm|.

The difference in the thermal expansion occurs between the base plate (having a coefficient of thermal expansion α1) and the connecting board (having a coefficient of thermal expansion αm) and between the connecting board (having the coefficient of thermal expansion αm) and the mounting board (having a coefficient of thermal expansion α2). In this arrangement, the soft metal bodies inserted in the connecting board body are deformed (for example, deformed plastically) to absorb the stress produced between the base plate, the connecting board and the mounting board due to the difference in their coefficients of thermal expansion. Thus, the soft metal bodies, the surface-bonding pads of the base plate, the surface-bonding and mounting pads and the mounting boards are not damaged or broken by the stress.

Since the soft metal bodies are formed with the protruded portions on at least either one of its first and second surface sides, the stress produced between the base plate, the connecting board and the mounting board can be much absorbed by the protruded portions. As the protruded portions are deformed without being limited by the through holes in the connecting board, the protruded portions can be deformed more. Thus, they are deformed easily and absorb the stress. Parts of the soft metal bodies inserted in the through holes in the connecting board constitute the protruded portions, and the stress applied to the portion and its vicinity (i.e., the root portion) which coincides with the first surface and the second surface of the connecting board substrate is reduced by the deformation of the corresponding soft metal body. Thus, those portions of the soft metal bodies are not formed with cracks or are not broken.

A larger difference in thermal expansion is produced between one of two pairs of boards (i.e., the pair of the base plate and the connecting board or the pair of the connecting board and the mounting board) which has a larger difference in the coefficients of thermal expansion (|α1−αm| or |α2−αm|) than the other pair of boards. In the arrangement of this aspect of the present invention, the space (A1 or A2) of said one pair of the boards which exhibit the larger difference in thermal expansion is larger than the space between said other pair of the boards. The stress due to the difference in thermal expansion can be absorbed by said one pair of the boards which exhibit the larger difference in thermal expansion. In this connection, the pads, the portions of the vicinity thereof and/or the soft metal bodies are not broken not only at the side of the smaller difference in thermal expansion but also at the side of the smaller difference in thermal expansion.

According to a further aspect of the present invention, the first protruded portion protrudes a first protruding height Z1 from the first surface and the second protruded portion protrudes a second protruding height Z2 from the second surface, the first protruding height Z1 is made larger than the second protruding height Z2 if the difference between the first coefficient of thermal expansion $\alpha 1$ and the third coefficient of thermal expansion $\alpha m$ is larger than the difference between the second coefficient of thermal expansion $\alpha 2$ and the third coefficient of thermal expansion $\alpha m$, and the second protruding height Z2 is made larger than the first protruding height Z1 if the difference between the second coefficient of thermal expansion $\alpha 2$ and the third coefficient of thermal expansion $\alpha m$ is larger than the difference between the first coefficient of thermal expansion $\alpha 1$ and the third coefficient of thermal expansion $\alpha m$. In other words, $Z1>Z2$ when $|\alpha 1-\alpha m|>|\alpha 2-\alpha m|$, and $Z1<Z2$ when $|\alpha 1-\alpha m|<|\alpha 2-\alpha m|$.

Since, in this aspect, the protruding height Z1 or Z2 of one of the protruded portions at the side of the larger difference in thermal expansion is made higher than the protruding height Z2 or Z1 of the other of the protruded portions, the space A1 or A2 at the side of the larger difference in thermal expansion can be easily made larger than the other space.

The soft metal bodies which are deformed easily project more at the side of the larger difference in thermal expansion so that the soft metal bodies at this side can be deformed largely to absorb the stress well. Thus, the pads, the solder in the vicinity thereof and/or the soft metal bodies are not damaged or broken, thereby leading to high bonding reliability.

According to a further aspect of the present invention, higher one of the first and second protruded portions is shaped like post and has a height larger than a maximum diameter thereof.

When the protruded portions which have a substantially spherical shape or a substantially semi-spherical shape are made higher in order to widen the space between the connecting board and the base plate or the mounting board, the maximum diameter of the protruded portions are also made larger so that the distance (pitch) between the adjacent soft metal bodies is limited in general. However, such limitation is not imposed on the arrangement of this aspect, and the space between the connecting board and the base plate or the mounting board at the side of the higher protruded portions can be made large. Further, the protruded portions are made relatively small in diameter so as to be deformed easily. Thus, much stress can be absorbed.

According to a further aspect of the present invention, the base plate and the connecting board are made of substantially the same ceramic and the mounting board is made of resin selected from the group consisting of epoxy resin, BT resin, glass epoxy resin and glass BT resin, and the distance A1 is made smaller than the second distance A2.

As the mounting board is made of resin such as epoxy resin which has a larger coefficient of thermal expansion than that of ceramic, stress is produced between the base plate and the mounting board when they are directly bonded together. In the arrangement of this aspect, however, the connecting board is interposed therebetween. Further, because the base plate and the connecting board substrate are made of substantially the same ceramic, little stress is produced between the base plate and the connecting board substrate but most stress is produced between the connecting board and the mounting board. Therefore, the surface-bonding pads of the base plate, the solder disposed in the vicinity thereof and/or the soft metal bodies are not damaged or broken.

The stress produced between the connecting board and the mounting board is absorbed by the second protruded portions because they are deformed easily. Since the spaces are set so that A1<A2, much more stress can be absorbed on the second surface side. In this connection, the stress is also absorbed between the connecting board and the mounting board so that the surface-bonding and mounting pads and/or the solder disposed in the vicinity thereof is not damaged or broken.

As a result, the stress between the base plate and the connecting board and between the connecting board and the mounting board is reduced, whereby destruction can be prevented and high bonding reliability can be attained.

According to a further aspect of the present invention, there is provided an assembly of a base plate having a plurality of surface-bonding pads, a mounting board having a plurality of surface-bonding and mounting pads at corresponding positions to the surface-boding pads and an connecting board disposed between the base plate and the mounting board for connection of the base plate and the mounting board through connection at the surface-bonding pads on a first side surface of the connecting board and at the surface-bonding and mounting pads on a second surface side of the connecting board, the connecting board comprising a substrate in the form of flat plate, having the first surface and the second surface and a plurality of through holes extending between the first and second surfaces, the substrate being made of substantially the same material as the base plate, and a plurality of soft metal bodies mounted in the through holes, respectively, each of the soft metal bodies having a protruded portion having a protruding height Z2, wherein the surface-bonding pads are connected to the protruded portions of the soft metal bodies with solder having a lower melting point than that of the soft metal bodies thereby to connect the base plate to the connecting board at a distance A1 between the base plate and the connecting board on the first surface side, and wherein the distance A1 is made smaller than the protruding height Z2.

Since the base plate and the connecting board are made of substantially the same material, little difference and little stress are produced therebetween. Thus, the surface-bonding pads, the solder disposed in the vicinity thereof thereto and/or the soft metal bodies are not damaged or broken. The space A1 therebetween may be small or narrow because it is unnecessary to widen the space to absorb the stress.

When, on the other hand, the subassembly consisting of the base plate and the connecting board is bonded to the mounting board, the stress is produced due to the difference in thermal expansion resulting from the difference in the coefficients of the thermal expansion. Since, however, the protruded portions made of soft metal are formed on the second surface side, the stress is absorbed by the deformation of the protruded portions.

The protruding height Z2 of the second protruded portions (the second protruding height) is selected to be larger than A1. Since the protruded portions exist between the connecting board and the mounting board, the space A2 defined therebetween is larger than the protruding height Z2 of the second protruded portions. That is, A2>Z2>A1. According to this arrangement, the space A2 between the connecting board and the mounting board can be always made larger than the space A1 between the base plate and the connecting board so that stress can be absorbed to such a degree corresponding to the amount by which the space A2 is larger.

Therefore, in an assembly formed by joining the base plate, the connecting board and the mounting board, the stress can also be absorbed between the connecting board and the mounting board, resulting in high bonding reliability.

According to a further aspect of the present invention, there is provided a method of making an connecting board to be disposed between a base plate having a plurality of surface-bonding pads and a mounting board having a plurality of surface-bonding and mounting pads at corresponding positions to the surface-bonding pads, for connection of the base plate and the mounting board through connection at the surface-bonding pads on a first surface side of the connecting board and at the surface-bonding and mounting pads on a second surface side of the connecting board, the connecting board including a substrate in the form of flat plate, having the first surface and the second surface and a plurality of through holes extending between the first and second surfaces, and a plurality of soft metal bodies mounted in the through holes, respectively, each of the soft metal bodies having at least one of a first protruded portion protruding from the first surface so as to have a first protruding height Z1 and a second protruded portion protruding from the second surface so as to have a second protruding height Z2, the first protruding height Z1 and said second protruding height Z2 being different from each other, the method comprising the steps of pouring molten soft metal into the through holes of the connecting board substrate from either of the first surface side and the second surface side of the connecting board, to form said soft metal bodies.

With this method, the soft metal bodies can be easily formed.

According to a further aspect of the present invention, the method of making a connecting board, further comprising the steps of disposing, under the connecting board, a jig, for receiving molten soft metal, made of unwettable metal to molten soft metal and having depressions at corresponding positions to the through holes, holding the molten soft metal poured into the through holes, at at least the depressions and the through holes, and cooling and solidifying the molten soft metal.

According to these processes, a connecting board having soft metal bodies formed with protruded portions inserted in the through holes can be fabricated easily. With these processes, the shape or the like of the protruded portions can be varied arbitrarily by changing the shape of the depressions and/or the volume of the injected or poured soft metal.

When, for example, the volume of the soft metal is more than the sum of the volume of the depressions of the jig and the volume of the through holes of the connecting board body, the molten metal is swelled upward at the top of the through holes and is raised in a substantially semi-spherical shape or a substantially spherical shape by the surface tension and forms protruded portions maintaining the shape after solidification. The soft metal in each depression forms a protruded portion having a shape substantially complementary to the shape of the depression after solidification.

In case the volume of the soft metal is substantially equal to the sum of the volume of the depressions and the volume of the through holes, the soft metal is filled in the through holes at the height substantially flush with the top of the through holes, and protruded portions do not project beyond the top of the through holes whereas they are formed in the depressions.

When the volume of the soft metal is less than the volume of the depressions and the volume of the through holes, the protruded portions with the peripheral surface complementary to the shape of the peripheral surface of the depressions and with the lower end (i.e., the tip of the protruded portions) having a substantially semi-spherical shape are formed in the depressions if the soft metal becomes integral with the connecting board substrate in case the soft metal is wettable to the metal layer on the inner peripheral surface of the through holes.

The material of the jig for receiving molten soft metal can be suitably selected from the materials which are unwettable to the molten soft metal and have a good heat resistance. For example, use of carbon or boron nitride facilitates the formation of the depressions. Further, ceramic such as alumina, mullite, silicon nitride or the like having high heat resistance may be used.

According to a further aspect of the present invention, the jig for receiving molten soft metal is made of unwettable material to the molten soft metal and has a planar surface, and the method of making a connecting board, further comprising the steps of closely contacting the planar surface to one of the first surface and the second surface which is a lower surface of the connecting board, and cooling the soft metal poured into the through holes by holding the molten soft metal at least in the through holes and solidifying the molten soft metal.

With this method, the soft metal injected or poured into the through holes stays on the planar surface of the receiving jig disposed under the connecting board and is held in the through holes or on their upper surface. Thereafter, the molten soft metal is cooled and solidified. Thus, the soft metal hardly projects or protrudes little from the surface (lower surface) of the connecting board substrate which is in contact with the planar surface of the jig, and an connecting board having soft metal bodies inserted in the through holes can be formed easily. There are formed on the upper surface of the connecting board substrate, protruded portions whose shape is decided by the volume of the injected or poured soft metal.

With this method, the shape or the like of the protruded portions formed on the upper surface of the soft metal can be changed according to the difference between the volume of the through holes and the volume of the injected or poured soft metal.

When, for example, the volume of the soft metal is more than the volume of the through holes of the connecting board, the molten soft metal is swelled upward at the upper ends of the through holes, is raised in a substantially semi-spherical shape or in a substantially spherical shape, and forms protruded portions which maintain the shape. On the other hand, the portions of the soft metal which are on the lower surface side of the connecting board are made complementary to the planar surface of the jig so as to formed flat and do not project or protrude little from the lower surface.

According to a further aspect of the present invention, the method of making a connecting board, further comprising the steps of disposing metal pieces made of soft metal and having a predetermined shape at either of ends of the through holes on the first surface side or ends of the through holes on the second surface side, and heating and melting the metal pieces after the disposing of metal pieces and causing molten soft metal to flow into the through holes.

With this method, it is unnecessary to handle molten metal but it is sufficient that soft metal is heated and molten after it has been loaded or disposed on the required ends of the through holes. Since the soft metal which is melted by heating can be injected or poured into the through holes simultaneously or at one time, the connecting board can be formed easily.

The volume of the soft metal is constant because this volume is the volume of the metal pieces, each having a predetermined shape. Thus, the size of the soft metal bodies can be made constant. This makes the height and size of the protruded portions constant, leading to high bonding ability between the base plate and the mounting board. It is enough that the soft metal has a constant shape and a constant volume. Its shape may be spherical, cubic or in any other suitable shape. Since the metal pieces are melted, it does no matter how they are shaped.

The metal pieces made of soft metal are only required to have a constant shape and a constant volume.

According to a further aspect of the present invention, the metal pieces are spherical.

It is preferred that the metal pieces are made spherical and their diameter is made constant, their volume can preferably be made constant. The spherical metal pieces are available at ease and can be put on the ends of the through holes without considering the state or posture in which the metal pieces are disposed. After a plurality of spherical metal pieces (soft metal balls) have been put on the connecting board at random, the base plate is swung in a suitable way, for example by inclining it. Then, the spherical metal pieces are fitted in the through holes of the connecting board body and become immovable, and the spherical metal pieces which are not fitted in the through holes are removed easily, leading to easy loading or disposition of the spherical metal pieces.

According to a further aspect of the present invention, a method of making an connecting board to be disposed between a base plate having a plurality of surface-bonding pads and a mounting board having a plurality of surface-bonding and mounting pads at corresponding positions to the surface-bonding pads, for connection of the base plate and the mounting board through connection at the surface-bonding pads on a first surface side of the connecting board and at the surface-bonding and mounting pads on a second surface side of the connecting board, the connecting board including a substrate in the form of flat plate, having the first surface and the second surface and a plurality of through holes extending between the first and second surfaces, and a plurality of soft metal bodies mounted in the through holes, respectively, each of the soft metal bodies having at least one of a first protruded portion protruding from the first surface so as to have a first protruding height Z1 and a second protruded portion protruding from the second surface so as to have a second protruding height Z2, the first protruding height Z1 and the second protruding height Z2 being different from each other, the method comprising the steps of preparing a receiving jig for receiving molten soft metal, made of a material unwettable to molten soft metal and having depressions corresponding in position to the through holes and a loading jig made of a material unwettable to molten soft metal, disposing metal pieces made of soft metal having a diameter larger than the depressions on upper end portions of the depression, disposing the connecting substrate over the jig for receiving molten soft metal so that the metal pieces are fitted in the through holes of the connecting board substrate, heating and melting the metal pieces, pressing the metal pieces and the connecting board substrate from above by means of the loading jig and pouring the molten soft metal into the through holes of the connecting board and into the depressions of the receiving jig for receiving molten soft metal, and cooling the molten soft metal while holding the molten soft metal at least in the depressions and the through holes and solidifying the soft metal.

Since, with this method, the metal pieces made of soft metal are loaded on the upper portions of the depressions of the jig for receiving molten soft metal so as to be fitted in the through holes of the connecting board, the metal pieces are not displaced or fall down. Thus, the molten soft metal is ensured to be injected or poured into the through holes.

The protruded portions can be shaped after the shape of the depressions. Thus, the protruded portions having not only a spherical shape but also any desired shape can be formed.

In order to obtain molten soft metal, the metal pieces made of soft metal is heated on the connecting board substrate. Thus, it is unnecessary to specifically handle the molten soft metal. The connecting board can be formed easily since the pouring of molten soft metal at one time can be attained only by heating.

Each metal piece has a predetermined shape. Thus, the volume of the injected or poured soft metal is constant and the size of each soft metal body can be made constant with the result that the height of each protruded portion and its shape are also constant. In this way, a connecting board can be bonded or connected securely to the base plate and the mounting board.

The material of the jig for receiving molten soft metal may be suitably selected from the materials having unwettability to molten soft metal and having a good heat resistance. For example, use of carbon or boron nitrite facilitates formation of the depressions. Further, alumina, mullite, silicon nitride or the like having a good heat resistance may be used.

According to a further aspect of the present invention, the method of making a connecting board further comprising the steps of disposing at least one small metal bit made of soft metal and having a smaller size than a diameter of each of the depressions in each of the depressions before the disposing of the metal pieces on the upper end portions of the depression, and melting the small metal bit to allow it to become integral with each of the metal pieces when each of the metal pieces is melted and poured into each of the depressions.

In order to inject or pour more soft metal into the depressions, it is better to enlarge the size of the metal pieces to be loaded or disposed. If the size of the metal pieces is too large, however, adjacent metal pieces sometime contact and spread over the upper surface of the jig for receiving molten soft metal before they are injected or poured into the depressions, or adjacent metal pieces sometimes contact and thus cannot be disposed in place on the upper portions of the depressions. With the method of the present invention, however, small metal pieces are disposed in the depression of the jig for receiving molten soft metal previously. Thus, the disadvantage produced by the contact of adjacent metal pieces as mentioned above does not occur and much soft metal can be held in the depressions. In this connection, for example, the depressions are formed deep (i.e., made elongated) and protruded portions having a large volume such as substantially pillar-like or post-like elongated protruded portions can be formed so as to be complementary to the shape of the depressions.

In this case, it is preferred that, when the metal pieces are loaded on the upper portions of the depressions of the jig for receiving molten metal, the small metal pieces are disposed on the depressions before being melted so as not to contact the metal pieces.

Upon contacting the small metal pieces disposed on the upper portions of the depressions, the metal pieces do not contact the edges of the upper portions of the depressions completely, and the metal pieces are not disposed in the depressions stably or they cannot be disposed therein.

The disposal of the metal pieces in non-contact with the small metal pieces allow the metal pieces to be disposed on the upper portion of the depressions. It is preferred that the metal piece be made of soft metal and be spherical.

Spherical metal pieces having a constant diameter are controllable and thus their volume can preferably be made constant and they are available easily. Further, the spherical metal pieces can also be disposed in the corresponding ends of the through holes without considering the direction of disposal.

A plurality of the spherical metal pieces of soft metal (soft metal balls) are disposed at random on the jig for receiving molten metal and then swung, for example, by inclining the jig. Many spherical metal pieces are fitted in the depressions in the jig and the other spherical metal pieces which are free from the depressions are removed easily by inclining the jig. Thus, the spherical metal pieces are easily disposed in position.

The above structures and methods can solve the above noted problems inherent in the prior art device and method.

It is accordingly an object of the present invention to provide a novel and improved connecting board which can make it easier the connection of a base plate to a mounting board and furthermore can attain such connection with an improved durability and reliability.

It is a further object of the present invention to provide a method of making a connecting board of the foregoing character.

It is a still further object of the present invention to provide an assembly of a base plate, a connecting board of the foregoing character and a mounting board.

BRIEF DESCRIPTION OF THE DRAWINGS

FIGS. 1A to 1C are enlarged fragmentary sectional views for illustrating the process of making a connecting board substrate, in which FIGS. 1A shows the connecting board substrate in a state prior to firing, FIG. 1B shows the connecting board substrate in a state after firing and FIG. 1C show the connecting board substrate in a state of being plated;

FIGS. 2A and 2B are enlarged fragmentary sectional views for illustrating the process of installing a soft metal body on the connecting board substrate of FIG. 1C, wherein FIGS. 2A shows the soft metal body and the substrate in a state before installation of the soft metal body on the substrate and FIG. 2B shows the soft metal body and the substrate in a state after installation of the soft metal body on the substrate;

FIGS. 7A and 7B are enlarged fragmentary sectional views for illustrating the process of forming solder layers on portions of the soft metal body located on the opposite sides (i.e., first and second surface sides) of the connecting board substrate, wherein FIG. 7A shows the connecting board together with transfer plates and FIG. 7B shows the connecting board in a state after reflow;

FIGS. 9A to 9C are enlarged fragmentary sectional views for illustrating the process of pouring soft metal into the connecting board substrate and allow it to penetrate therethrough, wherein FIG. 9A shows the state in which soft metal balls are mounted on the connecting board substrate, FIG. 9B shows the state in which the connecting board substrate having mounted thereon the soft metal balls is placed on a support, and FIG. 9C shows the state after pouring of soft metal;

FIGS. 11A and 11B are enlarged fragmentary sectional view for illustrating the process of connecting the base plate to the mounting board, wherein FIG. 11A shows that a mounting board, an connecting board and a base plate are placed one upon the other in this order, and FIG. 11B shows an assembly constituted by joining these three devices;

FIGS. 14A and 14B are enlarged fragmentary sectional views illustrating the process of disposing and inserting soft metal bodies on and into an connecting board substrate according to a third embodiment of the present invention, wherein FIG. 14A shows a state in which the soft metal balls are disposed on and inserted in every depression of a jig for receiving molten soft metal and FIG. 14B shows a state in which a connecting board is set and pressed by a loading jig;

FIGS. 16A and 16B are enlarged fragmentary sectional views showing the process of forming a solder layer on the upper end of each soft metal body, wherein FIG. 16A shows a state in which a low-temperature solder ball is set on the upper end of the soft metal body and FIG. 16B illustrates a state in which the solder layer is formed on the upper end of the soft metal body;

FIGS. 18A and 18B are sectional view s illustrating the process of connecting a pillar-shaped or post-shaped connecting board to a base plate and a mounting board, wherein FIG. 18A illustrates a state in which the base plate and the connecting board are connected together and FIG. 18B shows a state in which the connecting board is connected to both the base plate and the mounting board;

DETAILED DESCRIPTION OF THE PREFERRED EMBODIMENTS

Figure 1A:
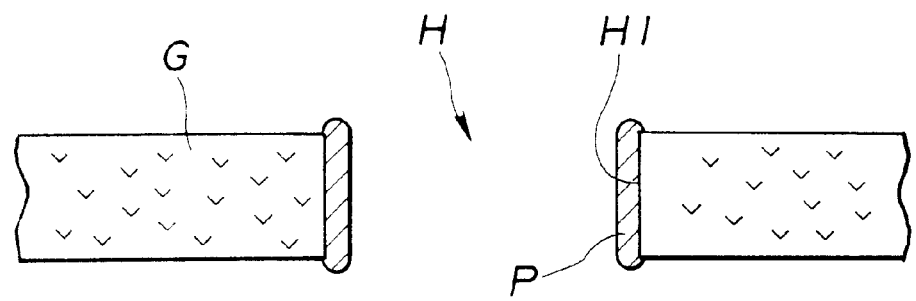

The present invention will now be described by way of the following preferred embodiments with reference to the accompanying drawings.

(First Embodiment)

Referring to FIGS. 1A to 3, a manufacturing method of an connecting board will now be described.

An alumina green sheet G having a plurality of through holes H (one of which is shown) is formed previously by the conventional ceramic green sheet forming technique. As shown FIG. 1A, tungsten paste is applied to the inner peripheral surface H1 of the through hole H in the sheet G.

The sheet G is sintered at the maximum temperature of substantially 1,550° C. in a reducing atmosphere to form an connecting board substrate 1 made of ceramic (hereinafter referred to only as the "substrate") and a base metal layer 2 made of a material containing tungsten as a major component. The substrate 1, which has been sintered, is in the form of flat plate which is 25 mm square and 0.3 mm thick. Each of the through holes H which extend through the substrate 1 between first surface 1a and a second surface 1b of the substrate 1 has an inner diameter of 0.8 mm. Three hundred and sixty-one (361) through holes H are arranged at a pitch of 1.27 mm so as to form a grid pattern consisting of 19 vertical rows and 19 horizontal rows. The thickness of the base metal layer 2 is substantially 10 µm.

Figure 1B:
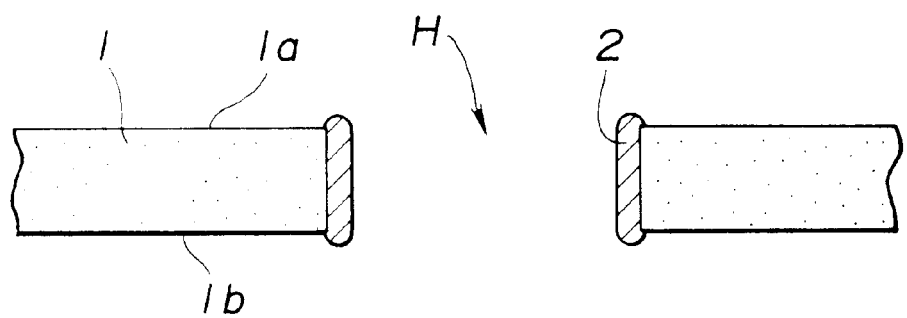
Figure 1C:
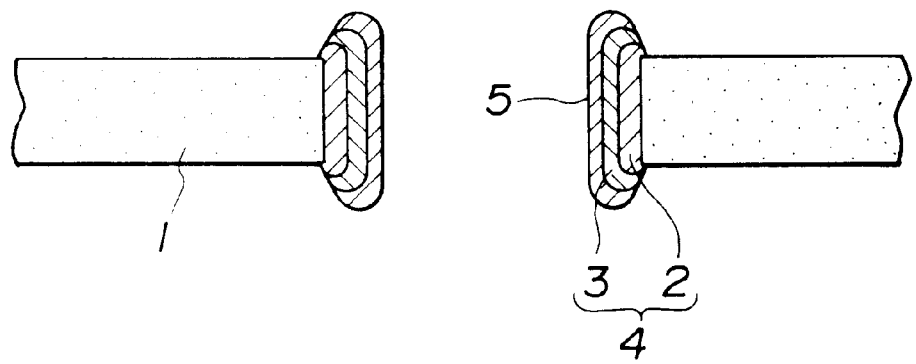

As shown in FIG. 1C, an electroless Ni—B plated layer 3 having a thickness of substantially 2 µm is formed on the base metal layer 2. Both layers 2 and 3 constitute a metal layer 4 onto which a soft metal body is welded as will be described later. In order to prevent oxidation of the Ni—B plated layer 3, an electroless gold-plated layer 5 is formed thereon.

Figure 2A:
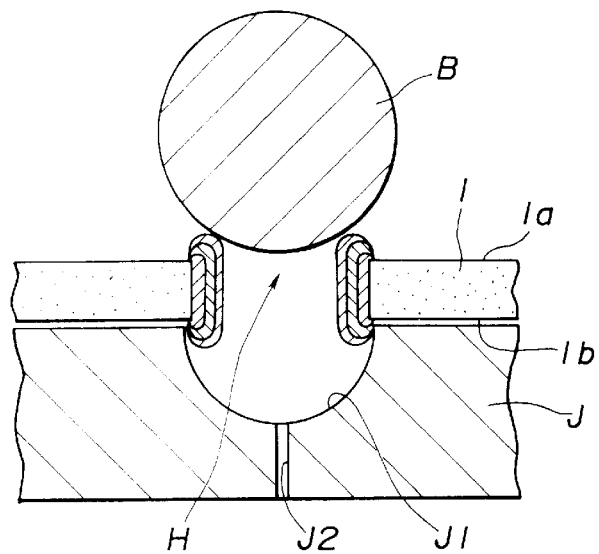
Figure 2B:
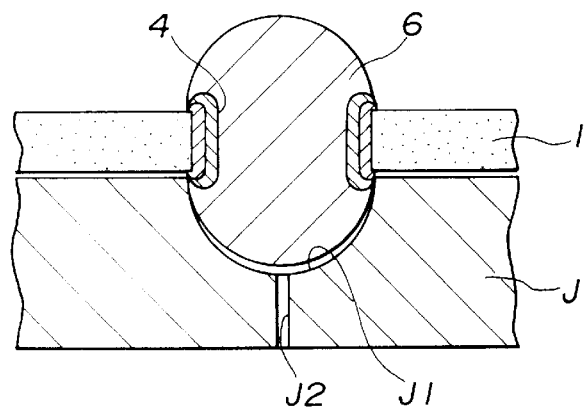

As shown in FIG. 2A, a jig J for receiving molten soft metal (hereinafter referred to as the "receiving jig") made of carbon has semi-spherical depressions J1 having a radius of 0.45 mm formed in its upper surface. The connecting board substrate 1 is placed on the receiving jig J with the second surface 1b of the substrate 1 facing the upper surface of the receiving jig J and with the through holes H aligned with the depressions J1. The receiving jig J made of carbon is unwettable to molten metal such as high temperature solder as will be described later. An air vent J2 having a small diameter (0.2 mm) extends through the receiving jig J from the bottom of each depression J1 to the lower surface of the receiving jig J. A high temperature solder ball B having a diameter of 0.9 mm is placed on the end of each through hole H on the first surface side (the upper end side of the through hole in the figure).

The connecting board substrate 1 loaded on the receiving jig J and having the high temperature solder balls B placed thereon are put in a reflow furnace and heated at the highest temperature of 360° C. for the maximum temperature holding time of one minute in a nitrogen atmosphere. Then, the high temperature solder balls B are melted. The molten high temperature solder is lowered or let to go downward under the gravity and injected or poured into the through holes H to be welded onto the metal layer 4 (the Ni—B plated layer 3). The portion of molten high temperature solder on the second surface 1b side of the connecting board substrate 1 (i.e., the lower portion) is swollen into a semi-spherical shape in the depressions J1 and formed after the shape of the depressions J1 of the receiving jig J, and the portion of the molten high temperature solder on the first surface 1a side of the connecting board substrate 1 (i.e., the upper portion) is swollen upward to such an extent corresponding to an amount by which the volume of the molten high temperature solder is larger than the volume of each through hole H. The upward swollen portion of the molten solder becomes substantially semi-spherical or spherical under the surface tension according to the volume of the molten solder. In this case, the shape is substantially semi-spherical.

The gold-plated layer 5 is diffused into the molten high temperature solder and the solder is directly welded onto the Ni—B plated layer 3. Thus, a soft metal body 6 made of high temperature solder is fixed to the connecting board body 1. The air vent J2 in the receiving jig J acts to relieve air in the depressions J1. Since the receiving jig J is not wettable to the solder and the air vent J2 is small in size, the solder does not enter the air vent J2. With this process, the soft metal bodies 6 made of high temperature solder are formed in the through holes H.

Figure 3:
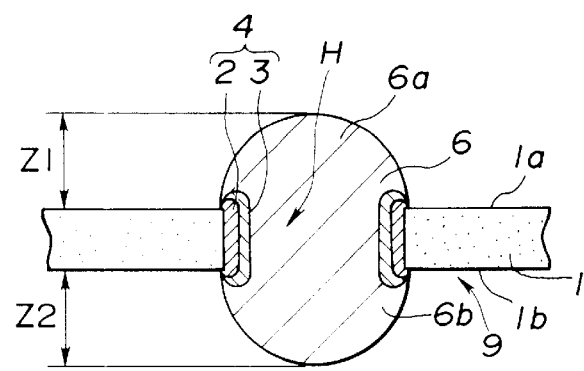
FIG. 3 is an enlarged fragmentary sectional view of how the soft metal body protrudes from the connecting board substrate.

As shown in FIG. 3, each soft metal body 6 is inserted in the corresponding through hole H of the connecting board substrate 1 and fixed to the body 1 through the metal layer 4. The portion of the soft metal body 6 which is at the side of the second surface 1b (the lower surface in the figure) of the connecting board substrate 1 forms a substantially semi-spherical protruded portion (a swollen portion) 6b which has a complementary shape to the shape of the depression J1 of the receiving jig J and has a height (the second protruding height) Z2 of 0.2 mm measured from the substrate 1 and a radius of 0.43 mm, and the portion of the soft metal body 6 which is on the first surface side (the upper surface side in the figure) 1a forms a substantially semi-spherical protruded portion (a swollen portion) 6a due to the surface tension and has a height (the first protruding height) Z1 of 0.2 mm and a radius of 0.43 mm. Not only the protruding height Z2 of the protruded portions 6b but also the protruding height Z1 of the protruded portions 6a are made constant because the high temperature solder balls B having the same volume are used. The protruding heights of the protruded portions 6a and 6b can be changed by varying the volume of the solder ball B through adjustment of the diameter of the solder body B.

In this embodiment, the protruding height Z1 of the protruded portions 6a can be made smaller by reducing the diameter of the solder balls B, and the protruding height Z2 of the protruded portions 6b can be made larger increasing the diameter of the solder balls B.

In this way, an connecting board 9 as shown in FIG. 3 is produced.

The connecting board 9 has a connecting board substrate 1 of a plate-like shape and made of alumina ceramic. The connecting board substrate 1 has a plurality of through holes extending therethrough between its first surface 1a and its second surface 1b. The connecting board 9 further has soft metal bodies 6 inserted or mounted in the through holes H.

Each metal body has a protruded portion 6a protruding from the first surface 1a and having a protruding height Z1 and another protruded portion 6b protruding from the second surface 1b and having a protruding height Z2 which is different from the protruding height Z1 of the protruded portion 6a. That is, Z1<Z2.

A base plate and a mounting board are bonded or connected to the connecting board 9 in the following manner to constitute an assembly.

A substantially square LGA type base plate 20 which has a thickness of 1.0 mm and a side of 25 mm is prepared as a base plate. The LGA type base plate 20 is made of alumina ceramic and is provided with flip-chip pads 21 for mounting IC chips on the upper surface 20a by means of flip-chip connection and pads (surface-bonding pads) 22, used as external connecting terminals, on the lower surface 20b. The pads 22 have a diameter of 0.86 mm and are arranged at a pitch of 1.27 mm so as to form a grid pattern consisting of 19 vertical rows and 19 horizontal rows in alignment with the soft metal bodies 6 of the connecting board 9. An electroless Ni—B material is plated on a molybdenum base layer. The flip-chip pads 21 and the pads 22 are connected by an internal wiring, not shown.

Figure 4A:
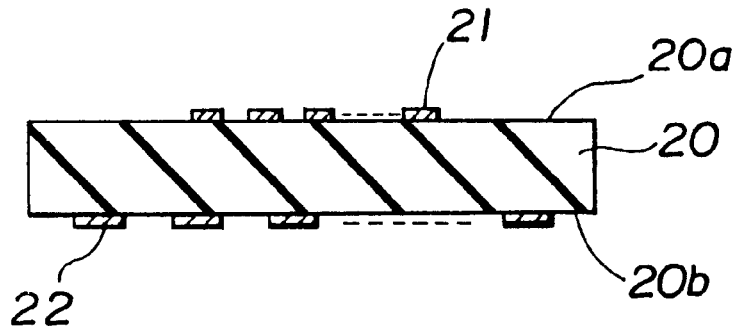
FIG. 4A is a sectional view of a base plate which is to be connected to the connecting board of this invention.
Figure 4B:
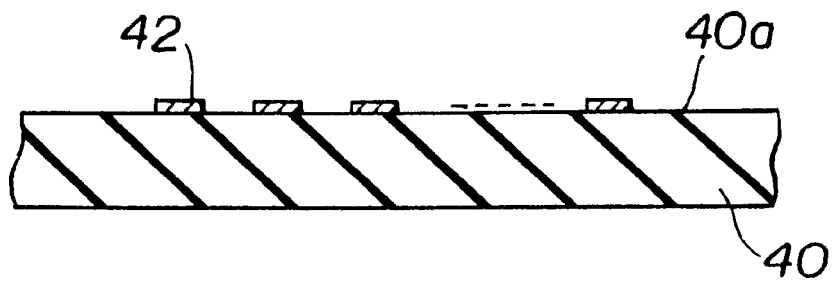
FIG. 4B is a cross-sectional view of a printed circuit board which is to be connected to the connecting board of this invention.

A printed circuit board 40 as shown in FIG. 4B is prepared as a mounting board. The printed circuit board 40 is in the form of flat plate and 1.6 mm thick and 30 mm square. The printed circuit board 40 is made of epoxy resin (Japanese Industrial Standard: FR-4). Pads (surface-bonding and mounting pads) 42 are formed on the main surface 40a of the printed circuit board 40 at the positions corresponding to the soft metal bodies 6 of the connecting board 9. The pads 42 are made of copper and have a thickness of 25 $\mu$m and diameter of 0.72 mm and are arranged at a pitch of 1.27 mm so as to form a grid patten consisting of 19 vertical rows and 19 horizontal rows.

Figure 5A:
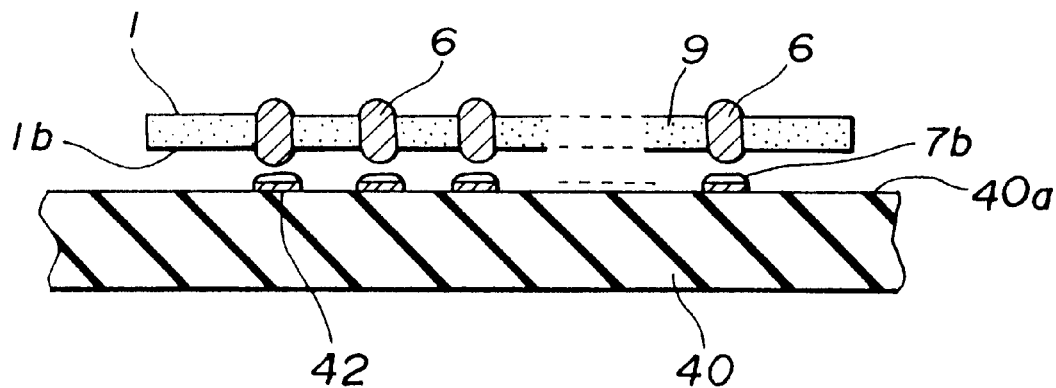
FIG. 5A is a sectional view for illustrating the process of connecting the connecting board to the printed circuit board of FIG. 4B.

As shown in FIG. 5A, the printed circuit board 40 is placed so that the main surface 40a having pads 42 is directed upward, and low temperature paste 7b (in this embodiment, eutectic solder paste) is applied to the pads 42 so as to have a thickness of 250 $\mu$m. Then, the connecting board 9 produced as described above is mounted on the printed circuit board 40.

The pads 42 are formed so as to be aligned with the protruded portions 6b on the second surface (the lower surface) 1b side of the connecting board substrate 1. By doing so, the connecting board 9 and the printed circuit board 40 are temporarily connected together.

Figure 5B:
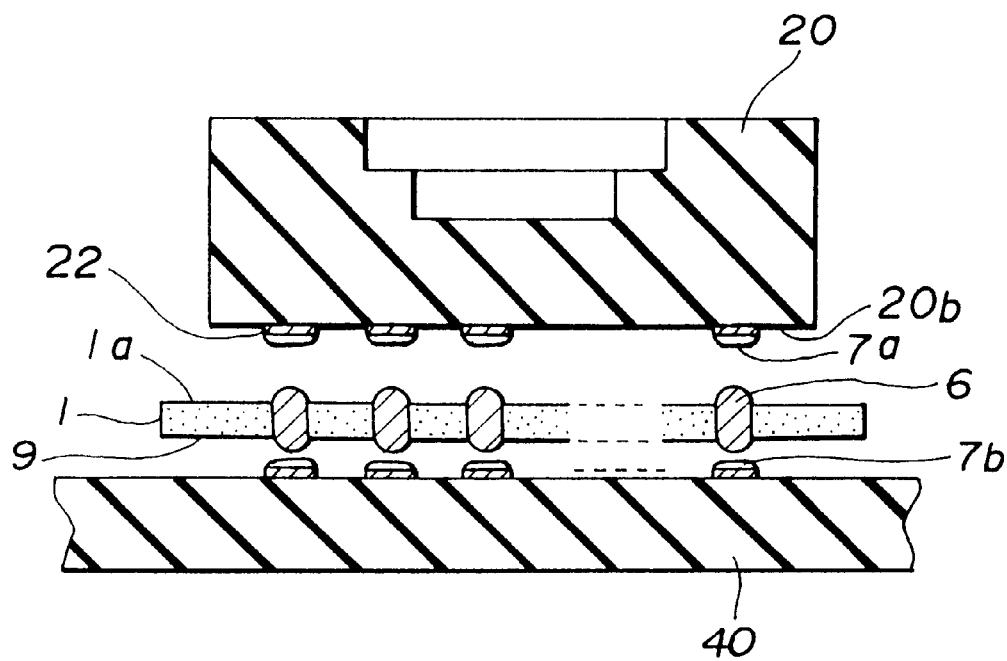
FIG. 5B is a sectional view for illustrating the process of further connecting the base plate of FIG. 4A to the connecting board in addition to the process of FIG. 5A.

As shown in FIG. 5B, the base plate 20 having the pads 22 previously coated with low temperature solder (eutectic solder) of a thickness of 250 $\mu$m is placed on the connecting board 9 so that the surface 20b having the pads 22 is directed downward. The pads 22 are formed so as to be aligned with the protruded portions 6a on the first surface 1a side of the connecting board 9 so that the base plate 20 and the connecting board 9 are temporarily connected by the adhering force of the solder paste 7a.

Figure 6:
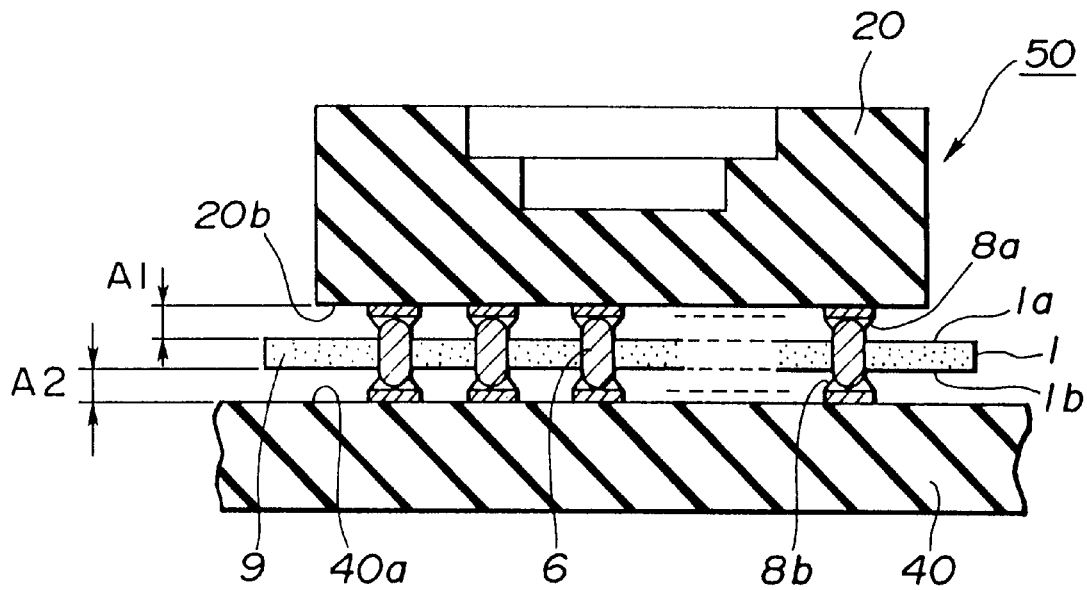
FIG. 6 is a sectional view of the base plate, the connecting board and the mounting board in an assembled or connected state.

The base plate 20, the connecting board 9 and the mounting board 40 are placed in a reflow furnace and maintained therein at the maximum temperature of 218° C. (or more than 200° C.) for the holding time of two minutes under a nitrogen atmosphere. The low temperature solder paste 7a and 7b are melted, and the pads 22 and 42 are bonded to the soft metal bodies 6 (the protruded portions 6a and 6b) through solder layers 8a and 8b simultaneously or at one time, as shown in FIG. 6.

In this case, the soft metal bodies 6 made of high temperature solder are not melted. The connecting board 9 is bonded to the LGA type base plate 20 and, at the same time, to the printed circuit board 40 whereby an assembly of the base plate, the connecting board and the mounting board is produced. In this way, the base plate 20 is bonded or connected by way of the connecting board 9 to the mounting board 40.

A space A1 between the first surface 1a of the connecting board substrate 1 and the lower surface 20b of the LGA base plate 20 is 0.24 mm, and a space A2 between the second surface 1b of the connecting board substrate 1 and the upper surface 40a of the printed circuit board 40 is 0.44 mm. The result is that A1<A2 because the protruding heights Z1 and Z2 of the upper and lower protruded portions 6a and 6b differ from each other, i.e., Z1<Z2.

Since flux is contained in the solder paste 7, the three assembly members can be bonded or joined together even if the pads 22 and 42 are not prevented from being oxidized by the metal-plated layers or the like.

Conventionally, low temperature solder paste is applied to the pads 22 of an LGA type base plate 20. After ball-shaped terminal members made of high temperature solder have been placed on the pads 22 one by one, the base plate is caused to reflow to form terminals. Thus, a BGA type base plate is formed from a LGA type base plate. Then, low temperature solder paste is applied to the pads 42 of a printed circuit board 40 and the BGA type base plate 20 is mounted on the printed circuit board 40. Then, reflow is conducted to bond or connect the two boards together. Alternately, low temperature solder is first applied to the pads 42 of the printed circuit board 40, so that after ball-shaped terminal members made of high solder or the like have been placed one by one on the pads 42 and the LGA type board applied with low temperature solder paste has been placed on the printed circuit board 40, reflow is conducted to bond the two boards together.

According to the method of the present invention, however, the printed circuit board 40 can be bonded or connected to the base plate 20 easily only by applying low temperature solder paste to the base plate 20 and the printed circuit board 40, by placing them one upon the other and heating them. Thus, it is unnecessary to use the process of loading the ball-shaped terminal members one by one on the pads 22 or 42 in order to change an LGA type base plate to a BGA type base plate.

In the above-mentioned embodiment, the printed circuit board 40, the connecting board 9 and the LGA type base plate 20 are placed one upon another in this order and reflow is performed. The printed circuit board 40, the connecting board 9 and the LGA type base plate 20 are bonded or connected together simultaneously or at one time. However, they need not be bonded together simultaneously or at one stroke. For example, the connecting board 9 is connected to the LGA type base plate 20 to form a base plate with an connecting board to constitute a subassembly and then the subassembly is bonded or connected to the printed circuit board 40. Alternately, the connecting board 9 and the printed circuit board 40 are bonded together previously to form another subassembly and then the base plate 20 is bonded to the composite. In any case, the use of the connecting board 9 according to the present invention makes it unnecessary to load or dispose the terminal members one by one on the pads and allows the base plate and the mounting board to be bonded together through the connecting board only by heating them (subjecting them to a reflow process) once or twice. Therefore, IC chip makers or manufacturers and users can omit some troublesome steps and/or equipment.

When heating is carried out twice, it is preferred that the solder paste 7a and the solder paste 7b have different melting points.

In order words, in case the base plate 20 is bonded to the connecting board 9 to form a subassembly and then the printed circuit board 40 is bonded to the subassembly, the melting point of the solder paste 7a is made higher than that of the solder paste 7b. When the connecting board 9 and the printed circuit board 40 are bonded together by means of molten solder paste 7b, the temperature at which the solder layer 8a is not melted can be selected so that no displacement occurs between the base plate 20 and the connecting board 9.

When, on the other hand, the printed circuit board 40 and the connecting board 9 are bonded together to form another subassembly and then the board 20 is bonded to the composite, solder paste 7b having a higher melting point than that of solder paste 7a is used. In order to bond together the base plate 20 and the subassembly by the molten solder 7a, a temperature at which the solder paste 7b is not melted can be selected. Thus, no displacement occurs between the connecting board 9 and the printed circuit board 40.

Little stress is produced between the base plate and the connecting board substrate 1 in the assembly 50 of the present invention as shown in FIG. 6, because the base plate 20 and the connecting board substrate 1 are made of the same material and there is no difference in thermal expansion between them.

On the other hand, stress is produced between the connecting board substrate 1 and the printed circuit board 40 on the grounds that the materials of the connecting board substrate 1 and the printed circuit board 40 are different from each other. In this case, the maximum stress is produced in the protruded portions 6b at the side of the printed circuit board 40 and the solder layer 8b in the vicinity of the printed circuit board 40. The soft metal bodies 6 (protruded portions 6b) are plastically deformed easily and deformation of the protruded portions 6b reduces the stress. This results in reduction of the stress and leads to reliable bonding which is not broken easily.

Particularly, use of the connecting board 9 according to the present invention eliminates the production of the stress in the solder layer 8a in the vicinity of the pads 22 on the base plate 20 side where solder layer is broken easily due to the stress applied thereto as conventional. Since, according to the present invention, the stress produced between the connecting board 9 and the printed circuit board 40 is absorbed by the deformation of the soft metal bodies 6, the protruded portions 6b and the solder layer 8b are hardly broken.

In the above description, low temperature solder paste 7a and 7b is applied to the pads of the base plate 20 and the printed circuit board 40 without forming low temperature solder layers on the protruded portions 6a and 6b thereby bonding the three assembly members together. However, low temperature solder layers can be formed on the protruded portions 6a and 6b. This facilitates easier bonding.

Figure 7A:
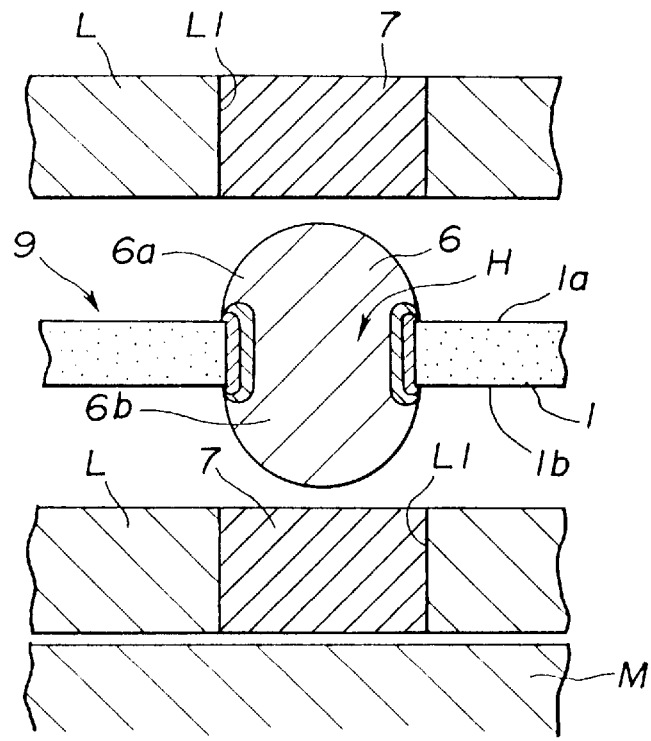

This is attained by the following way. On the contrary to the connecting board illustrated in FIG. 3, two carbon jigs (tranfer plates) L in the form of flat plate are prepared in which through holes (solder filling holes) L1 having a diameter of 0.86 mm and a height of 0.17 mm are formed. As shown in FIG. 7A, low temperature solder paste (eutectic solder paste) 7 is filled in the through holes by a squeezing process. This enables the volume of the paste 7 filled in the through holes L1 to be made constant. The through holes L1 of the transfer plates L are aligned with the soft metal bodies 6 (through holes H), the first transfer plate L, the connecting board substrate 1 and the second transfer plate L are placed one upon another in this order on a carbon support jig M (refer to FIG. 7A).

Figure 8:
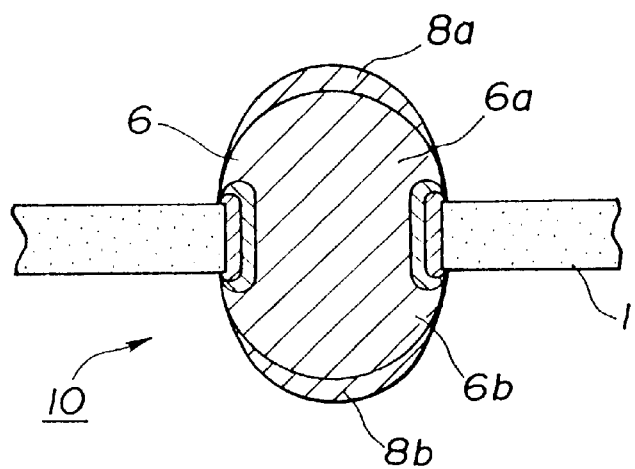
FIG. 8 is an enlarged fragmentary sectional view of the connecting board in a finished or completed state according to a first embodiment of the present invention.
Figure 7B:
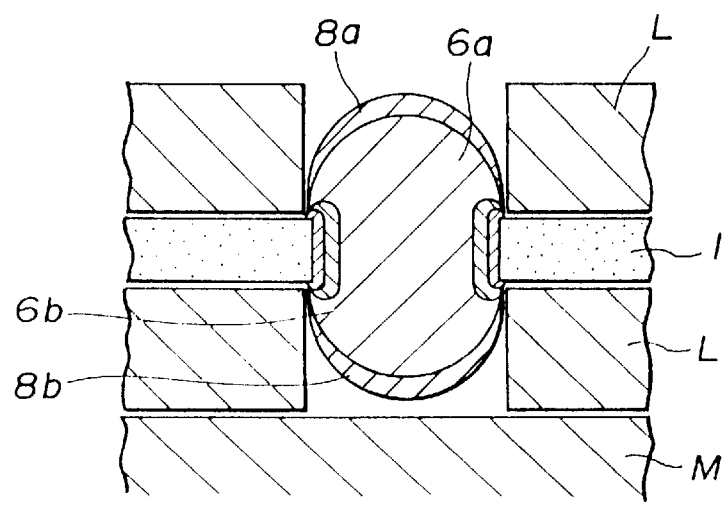

These boards are placed in a reflow furnace and heated at the maximum temperature of 220° C. for the maximum temperature holding time of one minute in a nitrogen atmosphere to melt the low temperature paste 7. Under this condition, the soft metal bodies 6 are not melted. As shown in FIG. 7B, the molten low temperature solder is wettable to the upper and lower protruded portions 6a and 6b and spreads thereover to form solder layer 8a and 8b so that the connecting board substrate 1 with solder layers 8a and 8b is formed as shown in FIG. 8. Since the volume of the paste of the solder layers 8a and 8b is constant, the height of the swollen portions are also constant.

Use of the connecting board substrate 1 with the solder layers permits for easy bonding of the base plate 20 to the printed circuit board 40 only by placing the connecting board 10 and the base plate 20 on the printed circuit board 40 and heating them. Thus, it is unnecessary to previously change the LCG type base plate to the BGA type base plate and to apply solder paste to the printed circuit board.

After the connecting board 10 having the solder layers 8a and 8b has been bonded to the LGA type base plate 20 to form a subassembly, the subassembly may be bonded to the printed circuit board 40. Alternately, the printed circuit board 40 and the connecting board 10 having the solder layers 8a and 8b may be bonded together first. In any case, use of the connecting board 10 having the solder layers 8a and 8b eliminates the necessity of application of low temperature paste and the loading or disposition of the terminal members on the pads one by one, and allows the base plate to be bonded to the mounting board through the connecting board by heating (ref lowing) them once or twice. Thus, IC chip makers or manufactures and/or users can omit troublesome processes and equipment further.

When heating is carried out twice, the melting point of the solder layer 8a may be made different from that of the solder layer 8b.

That is to say, in case the base plate 20 and the connecting board 10 are bonded together to form a subassembly, and then the printed circuit board 40 is bonded to the subassembly, solder having a higher melting point than that of the solder material of the solder layer 8b is used for the solder layer 8a. By melting the solder layer 8b at a temperature at which the solder layer 8a is not melted so as to bond the connecting board to the printed circuit board, displacement between the base plate and the connecting board can be prevented.

When, on the contrary, the printed circuit board 40 and the connecting board 10 are bonded together to form a subassembly and then the base plate 20 is bonded to the subassembly, solder having a higher melting point than that of the solder material of the solder layer 8b is used for the solder layer 8a. By melting the solder layer 8a at a temperature at which the solder layer 8b is not melted to bond the connecting board to the base plate, displacement between the connecting board 10 and the printed circuit board 40 can be prevented.

(Second Embodiment)

In the first embodiment, both protruded portions 6a and 6b are formed and the difference in protruding height is relatively small. However, the both protruded portions can be formed in such a way that the difference in protruding height is large. In the second embodiment, there will be described a connecting board having protruded portions protruding largely from one of its surfaces.

Similarly to the case of the first embodiment described with reference to FIGS. 1A to 1C, the connecting board has a connecting board substrate 1 made of ceramic and through holes H each formed with a metal layer 4 on the inner peripheral or circumferential surface. Similarly to the case of the first embodiment, the connecting board substrate 1 is in the form of flat plate 0.3 mm thick and 25 mm square and formed therein through holes H having an inner diameter of 0.8 mm. The through holes H are three hundred and sixty-one (361) in number and are arranged at a pitch of 1.27 mm so as to form a grid pattern consisting of 19 vertical rows and 19 horizontal rows.

Figure 9A:
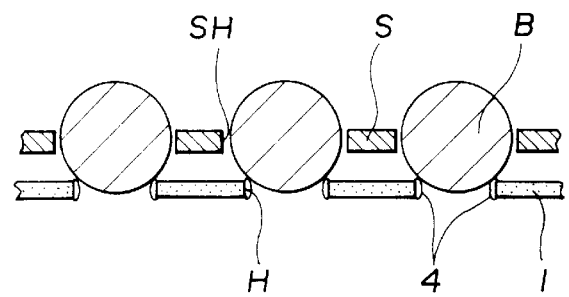

In the next step, high temperature solder balls B are placed on the upper ends of the through holes H of the connecting board substrate 1, as shown in FIG. 9A. This step can be done easily when it is performed in the following way. A ball control plate S formed with through holes SH having a diameter slightly larger than the diameter of the balls B at the positions corresponding to the through holes H is prepared and disposed above the connecting board substrate 1. Then, the high temperature solder balls B are placed at random on the ball control plate S, and the connecting board substrate 1 and the ball control plate S are held and swung. The balls B roll on the ball control plate S and fall in the through holes SH so as not to become immovable. After the balls B fall in all the through holes SH, the remaining balls B on the ball control plate S are removed. In this way, the balls B can engage the upper ends of all the through holes H, as shown in FIG. 9A. In the second embodiment, each high temperature solder ball B is made of 90% Pb—10% Sn and has a diameter of 0.9 mm. The ball limiting plate S has a thickness of 0.5 mm, and its through holes have a diameter of 1.0 mm.

Figure 9B:
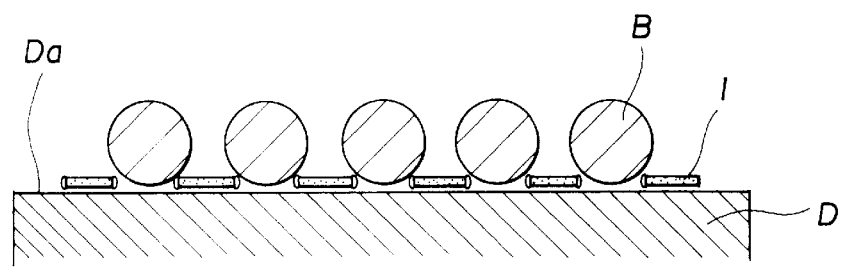

Thereafter, as shown in FIG. 9B, the ball control plate S is removed, and the connecting board substrate 1 on which the high temperature solder balls B are placed is mounted on a support D made of alumina ceramic having a good heat resistance, unwettable to molten high temperature solder and having a flat upper surface Da. Alternately, the connecting board substrate 1 may be placed on the support D, and then the balls B may be placed on the upper ends of the through holes H in the above-mentioned way.

The connecting board substrate 1 carrying the balls B and held on the support D is placed in a reflow furnace and is heated at the maximum temperature of 360° C. for the maximum temperature holding time of one minute in a nitrogen atmosphere so that the balls B are melted. The molten high temperature solder spreads and is moved downward under the gravity. Then, it is injected or poured into the through holes H and welded onto the metal layers 4 (Ni—B plated layers 3). After cooled, the connecting board 209 having soft metal bodies 206 (made of high temperature solder) inserted in the through holes H of the connecting board substrate 1 is produced.

Figure 9C:
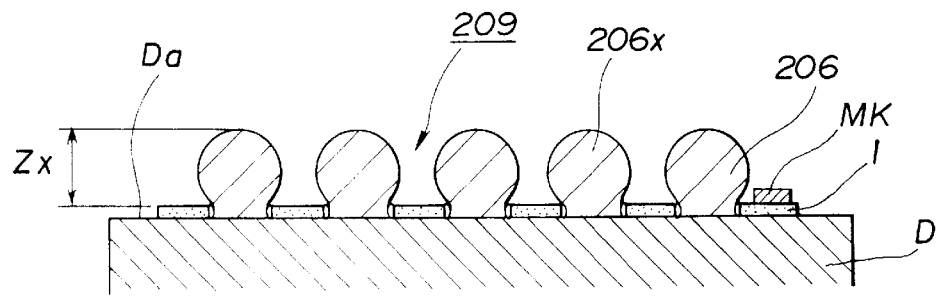

Since the support D is disposed under the connecting board substrate 1, the molten high temperature solder is made complementary to the flat upper surface Da of the support D. Thus, as shown in FIG. 9C, the portion of each soft metal body 206 which is on the lower surface side of the connecting board substrate 1 becomes substantially flush with the lower surface of the substrate 1 and does not protrude or protrude little therefrom. In an example according to this embodiment, the protruding height Zy of this portion of each soft metal body 206 was 0.03 mm (FIG. 10).

The portion of the molten high temperature solder which is on the upper surface side of the connecting board substrate 1 is swollen upward by an amount corresponding to the excess amount of the volume of the high temperature solder relative to the volume of each through hole H and forms a protruded portion 206x. The swollen portion is formed under the surface tension and is made substantially spherical or semi-spherical according to the excess volume of the high temperature solder. In an example of this embodiment, the shape of the protruded portion was a substantial three-quarter sphere having the maximum diameter of 0.9 mm and a protruding height Zx of 0.7 mm measured from the upper surface of the connecting board substrate 1.

Similarly to the case of the first embodiment, the gold plated layer 5 is melted and diffused into the molten high temperature solder. Thus, the soft metal bodies 206 made of high temperature solder is directly deposited on the Ni—B plated layers (metal layers 4) and fixed to the connecting board substrate 1. When there is a gap between the connecting board body 1 and the upper surface Da of the support D while high temperature solder is being melted, the molten high temperature solder in one through hole sometimes spreads laterally through the gap and connected with the molten high temperature solder for another through hole. In order to avoid this, it is better to put a load on the connecting board substrate 1 or to press the substrate 1 toward the support D.

Figure 10:
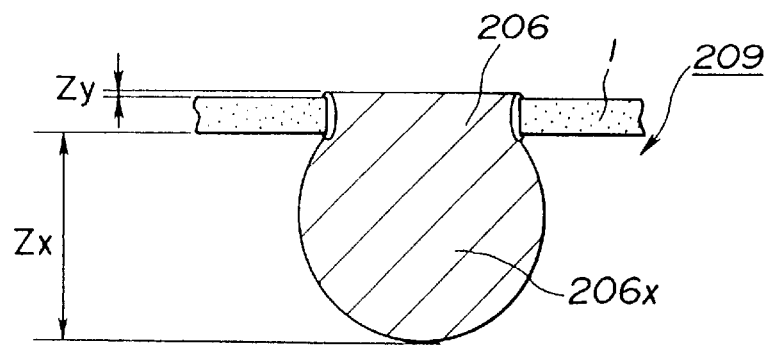
FIG. 10 is an enlarged fragmentary sectional view of the connecting board according to the second embodiment of the present invention.

As shown in FIG. 10, the heights Zx and Zy of the protruded portions on the upper and lower surfaces of the connecting board 209 greatly differ from each other. In order to distinguish the two surfaces (upper and lower surfaces) of the connecting board 209, a mark MK is indicated by high heat resistive ink on the upper surface (i.e., the surface on which the protruded portions 206x are formed) of the connecting board body 1.

In the same way as the case of the first embodiment, the thus produced connecting board 209 is bonded to the LGA type base plate 202 and the printed circuit board 240 in the following way.

Figure 11A:
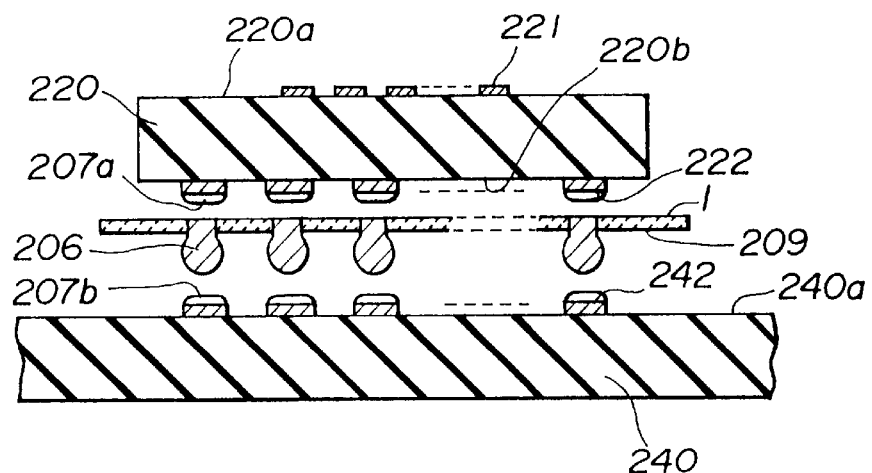

As shown in FIG. 11A, a LGA type base plate 220 1.0 mm thick and 25 mm square is prepared to be bonded to the connecting board 209. The LGD type base plate 220 is made of alumina ceramic and has flip chip pads 221 provided on the upper surface 220a, for mounting thereon IC chips by means of flip chip bonding, and pads (surface-bonding pads) 222 provided on the lower surface 220b, for serving as external connecting terminals. The pads 222 have a diameter of 0.86 mm and arranged at a pitch of 1.27 mm so as to form a grid pattern consisting of 19 vertical rows and 19 horizontal rows. Electroless Ni—B plating is applied to a molybdenum base layer and further electroless gold plating is applied thereto in order to prevent oxidation. The pads 222 are connected to the flip chip pads 221 by means of internal wiring, not shown.

A printed circuit board 240 as shown in FIG. 11A is prepared as a mounting board. The printed circuit board 240 is made of glass epoxy resin (Japanese Standard: FR-4) and in the form of rectangular plate of 1.6 mm thick, 230 mm long and 125 mm wide (i.e., 230 mm×125 mm). Pads 242 are formed at the positions corresponding to the pads 222 of the LGA type base plate 220. The pads 242 are made of copper and have a diameter of 0.72 mm and a thickness of 25 $\mu$m and are arranged at a pitch of 1.27 mm so as to form a grid pattern consisting of 19 vertical rows and 19 horizontal rows, the number of the pads 242 being three hundred and sixty-one (361). Eight groups of such pads 242 are arranged on the printed circuit board 240 so as to form a pattern consisting of two vertical rows and four horizontal rows so that eight base plates 220 can be bonded thereto simultaneously.

As shown in FIG. 11A, the printed circuit board 240 is placed with its main surface 240a directed upward, and low temperature solder paste 207b is applied to the pads 242.

Then, the connecting board 209 is mounted on the printed circuit board 240 with the surfaces of the board 209 directed reversely to those of the connecting board of the case as shown in FIGS. 9A to 9C. In this case the pads 242 are provided to be aligned with the protruded portions 206x on the soft metal bodies 206. Since the mark MK is provided as described above, the surface bearing the protruded portions 206x can be known easily.

The base plate 220 applied with low temperature solder paste 207a on the pads 222 is mounted on the connecting board 209 with the surface 220b having the pads 222 directed downward and aligned with the soft metal bodies 206.

The base plate 220, the connecting board 209 and the mounting board 240 are put in a reflow furnace and heated at the maximum temperature of 218w (more than 200w) for a holding time of two minutes under a nitrogen atmosphere. The low temperature solder paste 207a and 207b is melted, and the soft metal bodies 206 are simultaneously bonded to the pads 222 and 242 through the low temperature solder layers 208a and 208b.

Figure 11B:
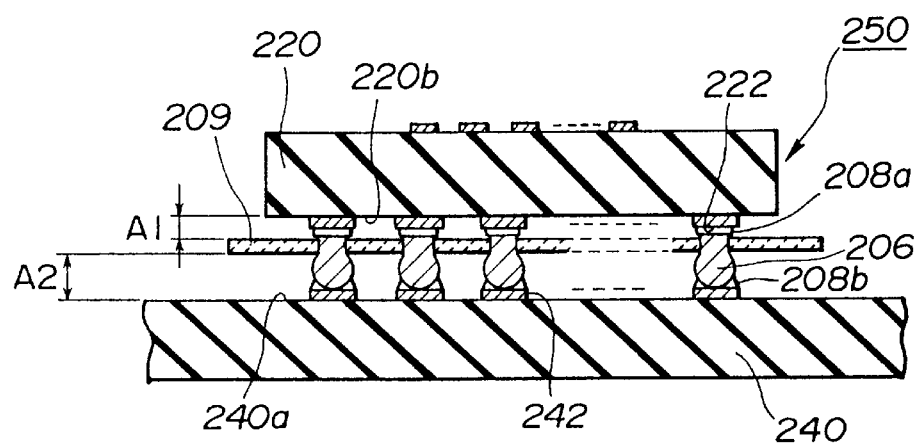

In this case, the soft metal bodies 206 made of high temperature solder are not melted. Thus, as shown in FIG. 11B, the connecting board 209 is bonded to the LGA type base plate 220 and, at the same time, to the printed circuit board 240. In this way, an assembly 250 is produced by bonding together the base plate, the connecting board and the mounting board. By doing so, the base plate 220 is bonded to the mounting board 240 through the connecting board 209.

The space A1 between the upper surface (the first surface) of the connecting board substrate 1 and the lower surface 220b of the LGA type base plate 220 is 0.05 mm, and the space A2 between the lower surface (the second surface) of the connecting board substrate 1 and the upper surface 240a of the printed circuit board 240 is 0.72 mm. In this way, the assembly 250 having a larger space A2 between the connecting board substrate 1 and the mounting board 240 than a space A1 between the base plate 220 and the connecting board substrate 1 (i.e., A1<A2) can be produced. This is because the soft metal bodies 206 little protrude on the first surface side with the result that the first protruding height Z1 (which is equal to Zy) is low whereas the protruded portions 206x on the second surface side is high. Thus, the second protruding height Z2 (which is equal to Zx) can be made large.

In this embodiment, particularly, the space A1 between the LGA type base plate 220 made of alumina ceramic and the connecting board substrate 1 made of alumina ceramic can be made much smaller than the space A2 between the connecting board substrate 1 and the printed circuit board 240 made of glass epoxy resin. With this structure, little stress is produced between the LGA type base plate 220 and the connecting board 209 (connecting board substrate 1) which are made of the same material due to the difference in thermal expansion, whereas stress is produced between the connecting board 209 and the printed circuit board 240.

Thus, the pads 222 of the LGA type base plate 220 and the solder layer 208 in the vicinity thereof are not broken. On the other hand, the stress exerted on the connecting board 209 in the thermal stress portion produced between the connecting board 209 and the printed circuit board 240 is applied to the portion of the protruded portion (the second protruded portion) 206x of each soft metal body 206 which is in the vicinity of the second surface, in the direction in parallel with the second surface. However, this stress is absorbed and reduced by the deformation of the soft metal body 206.

Further, since the space A2 is made large by the protruded portions 206x, they are deformed to reduce the stress. The thermal stress produced between the connecting board 209 and the printed circuit board 240 has a portion exerted on the printed circuit board side. This portion of the thermal stress is applied to the pads 242 in the direction of the main surface 240a. Since, however, the pads 242 are relatively strongly connected to the printed circuit board 240 and made of copper so that they deformed easily and not broken. Therefore, in the present invention, the connection between the LGA type base plate 220 and the printed circuit board 240 is hard to be broken as compared with the conventional connection between them without using the connecting board 209, and a long life can be attained.

Figure 12:
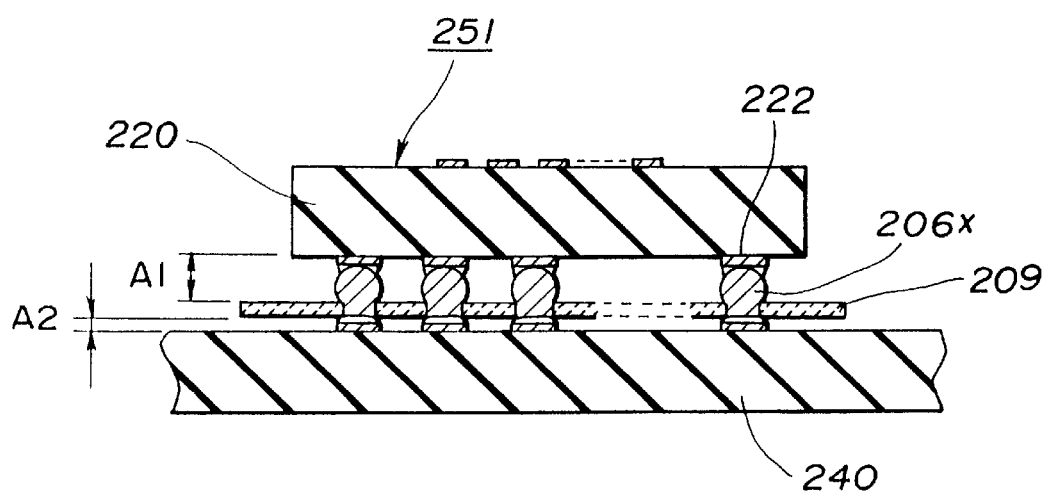
FIG. 12 is a sectional view of the assembly in which the connecting board is assembled in a state of being turned upside down.

On the contrary, when the protruded portions 206x are formed as the first protruded portions as shown in FIG. 12 in the same way as the case shown in FIG. 9C so that the protruded portions 206x are connected to the pads 222 of the board 220, there is produced an assembly 251 which has the space A1 of 0.72 mm between the base plate 220 and the connecting board substrate 1 and the space A2 of 0.05 mm between the connecting board substrate 1 and the printed circuit board 240. Since the protruded portions 206x of the soft metal bodies 206 has a large protruding height Z1 (which is equal to Zx) in this case, the space A1 is large, whereas the second protruding height Z2 (which is equal to Zy) is small. Thus, the space A2 is smaller than the space A1.

Such arrangement is desirable when, for example, the base plate is made of aluminum nitride which has a lower coefficient of thermal expansion than alumina of which the connecting board and the mounting board are made. Little difference in thermal expansion is produced between the connecting board and the mounting board whereas difference in thermal expansion occurs between the base plate and the connecting board. Thus, it is better to enlarge the space between the base plate and the connecting board substrate in such a way that the stress can be absorbed by the protruded portions 206x.

This arrangement can be applicable to the case in which, for example, an connecting board made of a resin material is interposed between a base plate made of ceramic such as alumina and a mounting board made of a resinous material such as glass epoxy resin.

Figure 13A:
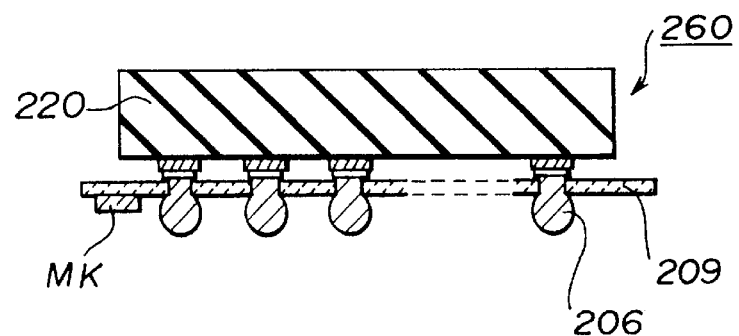
FIG. 13A is a sectional view for illustrating the process of connecting the base plate to the connecting board.
Figure 13B:
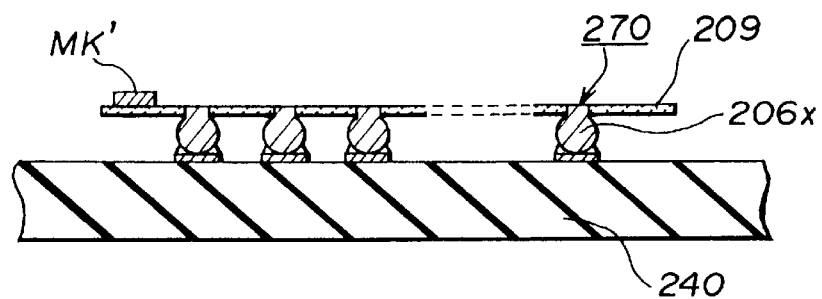
FIG. 13B is a sectional view for illustrating the process of connecting the mounting board to the connecting board.

In this embodiment, the assembly 250 is produced by piling the printed circuit board 240, the connecting board 209 and the LGA type base plate 220 in this order and bonding them together simultaneously or at one stroke. As described in the first embodiment, however, such a production method in which the assembly 250 is not completed at one stroke can be used. The connecting board 209 may be bonded to the LGA type base plate 220 to form a base plate with an connecting board (a subassembly of a base plate and a connecting board) 260 as shown in FIG. 13A, and then the subassembly 260 may be bonded to the printed circuit board 240 as shown in FIG. 13B. On the contrary, the connecting board 209 and the printed circuit board 240 may be bonded together first to form a printed circuit board with an connecting board (a subassembly of an connecting board and a mounting board) 270 as shown in FIG. 13B, and then the base plate 220 may be bonded to the subassembly 270.

In forming the subassembly 260 or 270, a surface-indicating mark MK by which the first surface can be distinguished from the second surface may be formed on the connecting board substrate. When wrong surfaces are selected in order to connect the base plate and/or the mounting board to the connecting board, the space A1 between the base plate and the connecting board and the space A2 between the connecting board and the mounting board have come to be greatly different from the predetermined value, possibly causing seriously adverse effects on reliability and the life. When, specifically, the surface-indicating mark MK is formed on the second surface of the base plate 1, it can be confirmed easily that the connecting board 209 is correctly bonded to the base plate 220 in case the subassembly 260 as shown in FIG. 13A is formed. Similarly, another mark MK' can be formed on the first surface of the substrate 1. With this mark MK', it can be confirmed that the connecting board 209 is correctly bonded to the mounting board 240 when the subassembly 270 is formed by bonding them together.

In the second embodiment, low temperature solder layers can also be formed on both sides of each soft metal body 206 of the connecting board 209 in order to form an connecting board with solder layers. This facilitates the bonding of the base plate and/or the mounting board to the connecting board.

Alternately, the transfer plate which is described in the first embodiment can be used. Alternately, the jig having the similar structure to that of the receiving jig J as described in the first embodiment can be used under the soft metal substrate 206 so as to form the low temperature solder layers, or metal pieces made of low temperature solder can be disposed on the soft metal bodies so as to be melted to form low temperature solder layers.

The metal pieces made of low temperature solder (for example, low temperature solder balls) are placed on the open ends of the depressions formed in the jig at the position corresponding to the protruded portions of the soft metal bodies. Then, the protruded portions of the soft metal bodies are inserted in the depressions. The connecting board is pressed against the jig and metal pieces are heated to be melted. Then, the low temperature solder wettably spreads over the surface of the soft metal bodies and forms solder layers thereon.

A ball control plate is arranged so that its through holes are disposed over the soft metal bodies. The low temperature solder balls are placed at random on the ball control plate and the ball control plate is swung suitably. Then, the balls fall in the through holes and become immovable. Thereafter, the unnecessary balls which are not received by the through holes are removed, for example, by tilting the ball control plate. In this way, the balls are loaded or disposed in place on the soft metal bodies. The low temperature solder is heated to melt and wettably spreads over the soft metal bodies so as to form low temperature solder layers.

(Third Embodiment)

There will now be described a third embodiment wherein the protruded portions of the soft metal bodies are not spherical or semi-spherical but has a shape like pillar or post.

As described in the first embodiment, there is prepared an connecting board substrate 1 which is made of alumina ceramic and is formed with metal layers 4 on the inner peripheral wall of the through holes H. Similarly to the case in the first embodiment, the connecting board substrate 1 is in a form of flat plate of of 0.3 mm thick and 25 mm square. The through holes H have an inner diameter of 0.8 mm and are arranged at a pitch of 1.27 mm so as to form a grid pattern consisting of 19 vertical rows and 19 horizontal rows. The total number of them is three hundred and sixty-one (361). On one of the surfaces (the lower surface in the figure) is formed with a surface-indicating mark MK which is printed with metallized ink and sintered at the time when the metal layers 4 are formed.

Then, soft metal bodies 306 are inserted in the through holes H. Pillar-shaped soft metal bodies 306 are formed by using a jig having the same structure as the receiving jig J. As shown in FIG. 14A, depressions Ni each having a conical tip, a diameter of 0.9 mm and a depth of 1.95 mm are formed at the positions corresponding to the through holes H in the upper surface of a solder piece holding jig N which is made of carbon having a good heat resistance and unwettable to the molten high temperature solder. Small air vents N2 having a diameter of 0.2 mm extend from the conical tip of the depressions N1 downward through the holding jig N.

Balls D1 having a diameter of 0.88 mm and made of high temperature solder, for example, an alloy of 90% of Pb and 10% of Sn are inserted in the depressions N1 of the holding jig N.

Actually, two balls D1 are inserted in each depression N1. A ball D2 having a diameter of 1.0 mm and made of high temperature solder, for example, an alloy of 90% of Pb and 10% of Sn is disposed on the free end (upper end) of each depression N1. It is convenient to use a ball control plate similar to the ball control plate S which is employed to load or dispose the high temperature solder balls B on the ends of the through holes H when the balls D2 are loaded on the free ends of the depressions N1 of the holding jig N in the second embodiment.

It is preferred that a small space be provided between the ball D2 and the upper ball D1 in each depression Ni so that they are not in contact with each other before they are melted and can contact each other after they are melted. In this arrangement, the ball D2 closely engages the upper edge of each depression Ni so as not to be moved or so as to be hardly moved with respect thereto, and the connecting board substrate 1 is easily positioned as will be described later.

As shown in FIG. 14B, a connecting board substrate 1 is placed on the balls D2 in such a manner that the balls D2 are fitted in the through holes H.

A loading jig Q having a good heat resistance and made of stainless steel which is unwettable to molten high temperature solder is placed on the substrate 1 in such a way that the flat surface (the lower surface in the figure) Q1 of the jig Q contacts the upper surface of the substrate 1 and presses the balls D2 downward.

The jigs N and Q and the body 1 disposed between both jigs N and Q are put in a reflow furnace and heated at the maximum temperature of 360° C. for the maximum temperature holding time of one minute in a nitrogen atmosphere to melt the high temperature solder balls D1 and D2.

The molten high temperature solder D2 is lowered to be inserted in the through holes H of the substrate 1 which is pressed downward by means of the loading jig Q and welded onto the metal layers 4 on the inner peripheral walls of the through holes H. The upper portion of the solder D2 is made flat after the shape of the flat surface Q1 of the loading jig Q at the upper end of each through hole H. The high temperature solder D2 is further inserted in the depressions N1 of the holding jig N and contacts the molten solder D1, so the molten solder D1 and the molten solder D2 tend to be joined together and be formed into one piece under the surface tension. However, since the solder D2 is welded onto the metal layers 4 and is made integral with the substrate 1, the solder D2 cannot be separated from the body 1. Thus, the solder D2 cannot fall on the bottom of the depressions but the solder D1 is raised lifted against the gravity to be joined with the solder D2. The substrate 1 is lowered by the loading jig Q until the upper surface of the substrate 1 pressingly contacts the upper surface N3 of the holding jig N. The air vents N2 prevent air from being confined in the depressions N1 and allow the air to be relieved therefrom.

Figure 15:
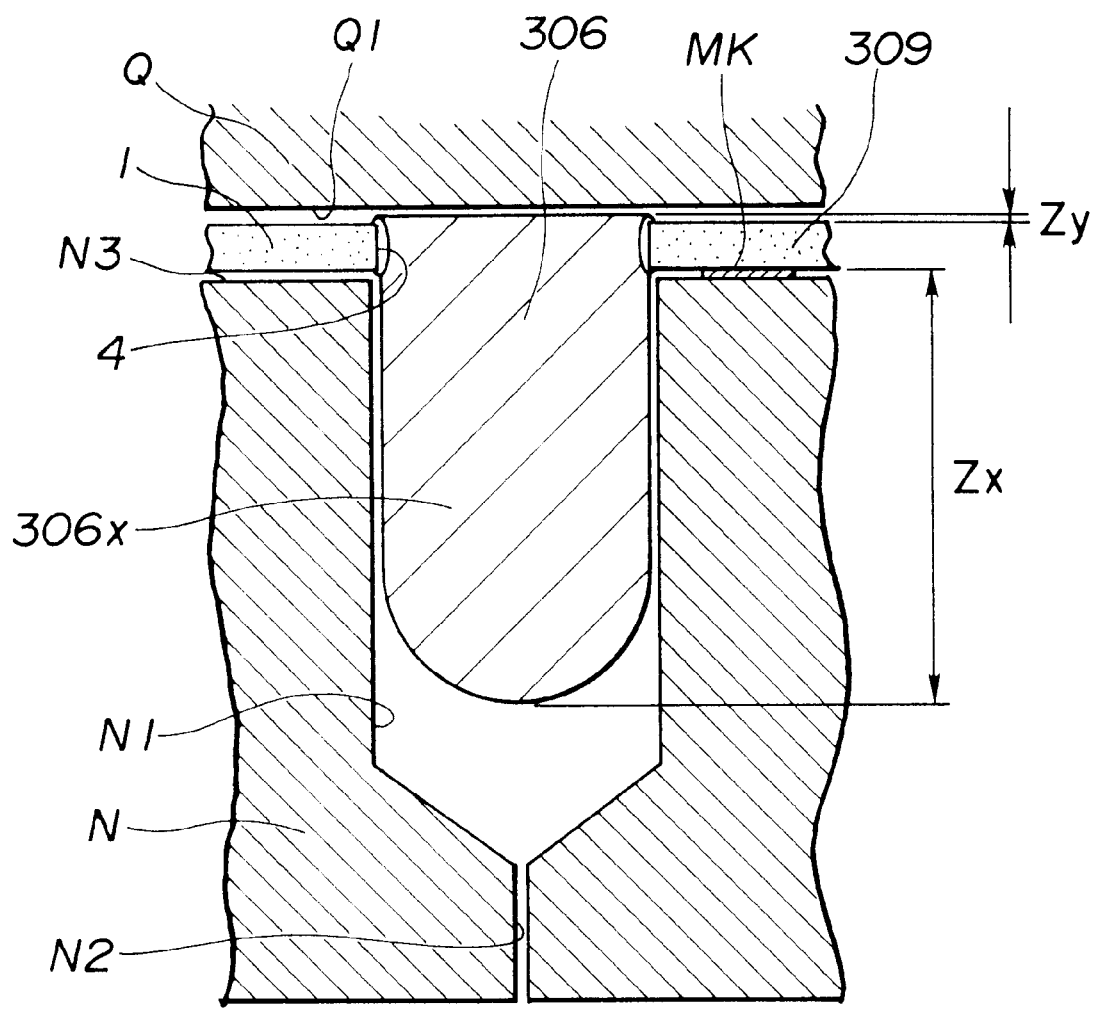
FIG. 15 is an enlarged fragmentary sectional view of the connecting board in which soft metal is inserted and on which pillar-shaped protruded portions are formed.

The high temperature solder is cooled to be solidified. By this, there is formed a connecting board 309 having, on the lower side of the substrate 1, soft metal bodies 306 with downward protruded portions 306x each having a substantially semi-spherical lower end but not provided with upward protruded portions or provided with very low upward extending protruded portions as shown in FIG. 15. In an example of the third embodiment, the protruded portion 306x has a diameter (the maximum diameter) of 0.88 mm in cross section and a protruding height Zx of 1.75 mm. Thus, the downward extending protruded portion 306x has a substantially cylindrical pillar shape and its height from the lower surface of the connecting board substrate 1 to the tip thereof is larger than the diameter. On the other hand, the height Zy of the protruded portions extending upward from the upper surface is 0.01 mm. A surface-indicating mark MK is formed on the lower surface of the connecting board substrate 1 as shown in FIG. 15. Thus, the mark MK is provided on the same surface on which the protruded portions 306x are formed and can be used as a mark indicating the surface on which the protruded portions 306x are formed.

Figure 16A:
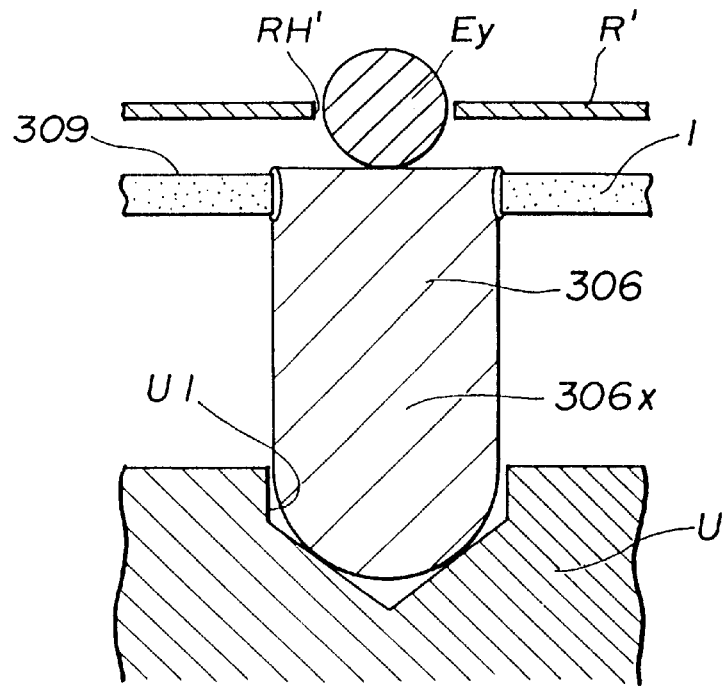

As shown in FIG. 16A, low temperature solder balls Ey made of Pb—Sn eutectic solder and having a diameter of 0.4 mm are placed on the upper surface of the soft metal bodies 306. This can be done easily by setting a ball control plate R' with the through holes RH' aligned with the soft metal bodies, placing the solder balls Ey at random on the ball control plate R', swinging the ball control plate R' and causing the balls Ey to fall in the through holes RH'. The ball control plate R' has a thickness of 0.5 mm and the through hole RH' has a diameter of 0.6 mm.

It is convenient to carry out the above placing of the solder balls Ey on the soft metal bodies 306 by holding the protruded portions 306x in the depressions N1 of the holding jig N as shown FIG. 15, i.e., under the condition in which only the loading jig Q is removed from the state shown in FIG. 15, or by using a soft metal holding jig U shown in FIG. 16A and allowing the tip ends of the protruded portions 306x to fit in the depressions U1 of the soft metal holding jig U. It is because the soft metal bodies 306 are made of soft and deformable high temperature solder.

Thereafter, reflow is conducted in a reflow furnace at the maximum temperature of 220° C. for the maximum temperature holding time of one minute in a nitrogen atmosphere thereby to melt the low temperature solder balls Ey. The soft metal bodies 306 are not melted under this temperature condition. The molten low temperature solder wettably spreads over the upper surfaces of the soft metal bodies 306 to form solder layers 308y as shown in FIG. 16B.

Since the volume of the low temperature solder ball Ey is constant, the solder layer 308y has a constant volume and thus it has a constant height. In this embodiment, the height of the solder layer 308y from the upper surface of the connecting board substrate 1 to the top of the solder layer 309y is 0.08 mm.

Figure 16B:
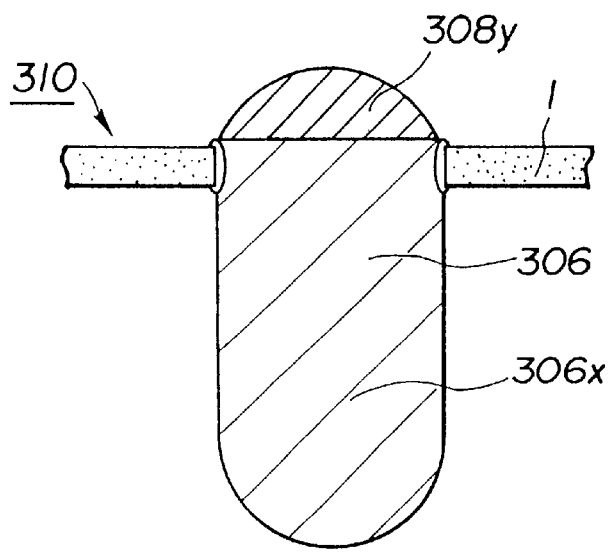

In this way, as shown in FIG. 16B, there is produced a connecting board 310 having connecting portions including soft metal bodies 306 and solder layers 308y which have a melting point lower than that of the soft metal bodies 306. That is, such a connecting board 310 with solder layers 308 is formed from the connecting board 309 including the connecting board substrate 1 having the through holes H extending therethrough between its upper and lower surfaces and the soft metal bodies 306 inserted in or mounted in the through holes H and having the protruded portions 306x protruding from the lower surface of the connecting board substrate 1. The outer surface of the connecting portions are continuous and oval-shaped.

Figure 17A:
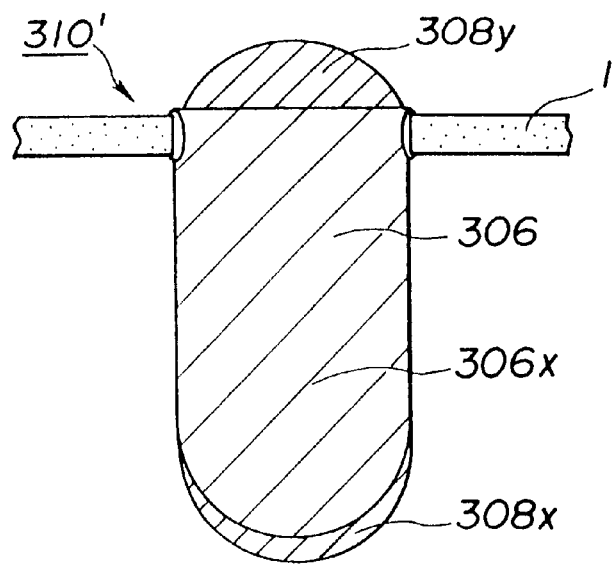
FIG. 17A is an enlarged fragmentary sectional view of a soft metal body with solder layers formed on both upper and lower ends thereof.
Figure 17B:
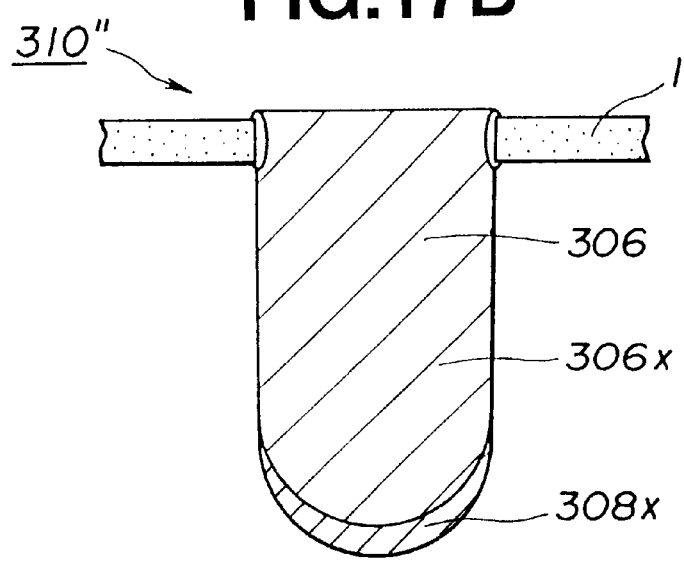
FIG. 17B is an enlarged fragmentary sectional view of a soft metal body with a solder layer formed on the lower end thereof.

In this embodiment, the solder layers 308y are formed only on the upper ends of the soft metal bodies 306. However, an connecting board 310' having such solder layers 308y and 309x formed on both end surfaces of the metal solder bodies can be produced by the method as described above in the first and second embodiments (see FIG. 17A). Alternately, there can be further produced an connecting board 310" having solder layers 308x formed only on the lower end surface, i.e., on the tips of the protruded portions 306x (see FIG. 17B). In each of these embodiments, the connecting portion has an oval-shaped continuous out surface.

Figure 18A:
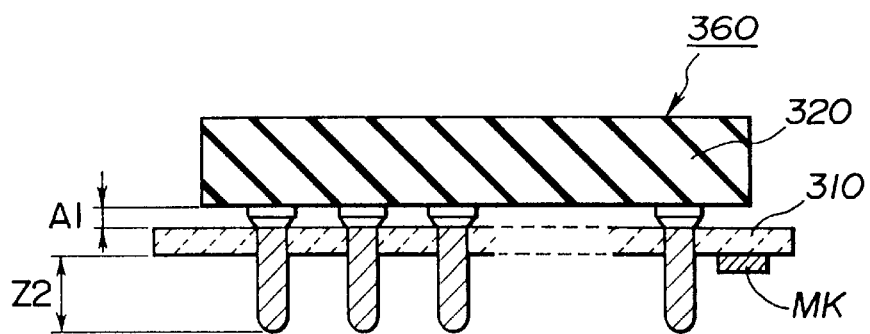

The connecting board 310 having the solder layers 308y and the LGA type base plate 320 are placed one upon the other and heated to be bonded together whereby a subassembly 360 as shown in FIG. 18A is formed. In this assembly 360, the space A1 between the base plate 320 and the connecting board substrate 1 is 0.03 mm. On the other hand, the protruding height Z2 (which is equal to Zx) of the protruded portions 306x extending downward from the connecting board substrate 1 is 1.75 mm. Since the mark MK formed on the connecting board substrate 1 can be observed from below, it can be confirmed that the connecting board 310 and the base plate 320 are bonded together correctly.

Figure 18B:
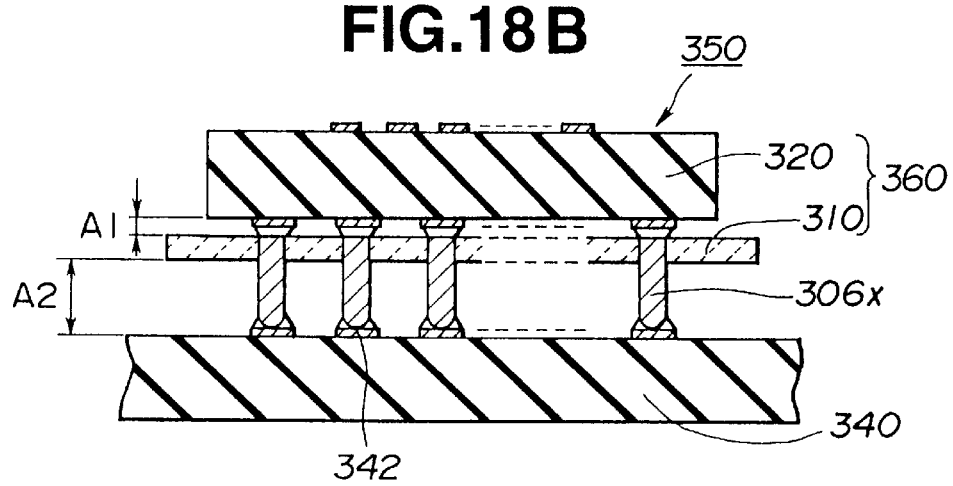

Thereafter, as shown in FIG. 18B, a printed circuit board 340 having pads 342 provided with low temperature solder paste (eutectic solder paste) is prepared, and the subassembly 360 is placed on the printed circuit board 340 with the pads 342 aligned with the protruded portions 306x. Then, the base plate 320, the connecting board 310 and the printed circuit board 340 are heated to melt the low temperature solder paste on the pads 342 and are bonded together thereby forming an assembly 350 as shown in FIG. 18A. In the assembly 350, the space A1 between the board 320 and the connecting board substrate 1 is 0.03 mm, whereas the space A2 between the connecting board substrate 1 and the printed circuit board 340 is 1.78 mm.

In this case, the space A2 between the substrate 1 and the printed circuit board 340 can be made larger than the cases of the first and second embodiments because the protruding height Z2 of the protruded portions (the second protruded portions) is made larger.

In this arrangement, the stress between the connecting board substrate 1 and the printed circuit board 340 can be reduced due to the increased space A2. Since the protruded portion 306x is in the form of a pillar or post having a height larger than the diameter, the protruded portion 306x can be deformed easily so as to absorb the stress. Further, the protruded portion 306x is made of soft metal. Thus, it is deformed easily to absorb the stress.

Since the distance between the adjacent soft metal bodies (i.e., adjacent surface-bonding pads) are usually set to a predetermined value, the maximum diameter of the protruded portion is restricted by that distance. On the other hand, it is considered that an allowable range with respect to the height of the protruded portion is large in many cases.

Accordingly, when the protruded portion is shaped like post or pillar, its protruding height can be made larger up to an allowable limit, with its maximum diameter being held under the limit, so it becomes possible to make larger the distance between the base plate and the mounting board and furthermore make thinner the protruded portion so that much more stress can be relieved.

Accordingly, it becomes possible to improve the reliability in the connection between the base plate and the connecting board or the connecting board and the mounting board by providing therebetween the pillar-shaped protruded portions of the soft metal bodies and make longer the life of the joint therebetween.

Solder paste having a lower melting point than the solder layers 30y formed on the connecting board 310 can be used as the low temperature solder paste to be applied to the pads 342. By doing so, the solder paste 307b can be melted without melting the solder layers 308y in order to bond the connecting board 310 and the mounting board 340 together.

(Evaluation of Reliability)

Figure 19:
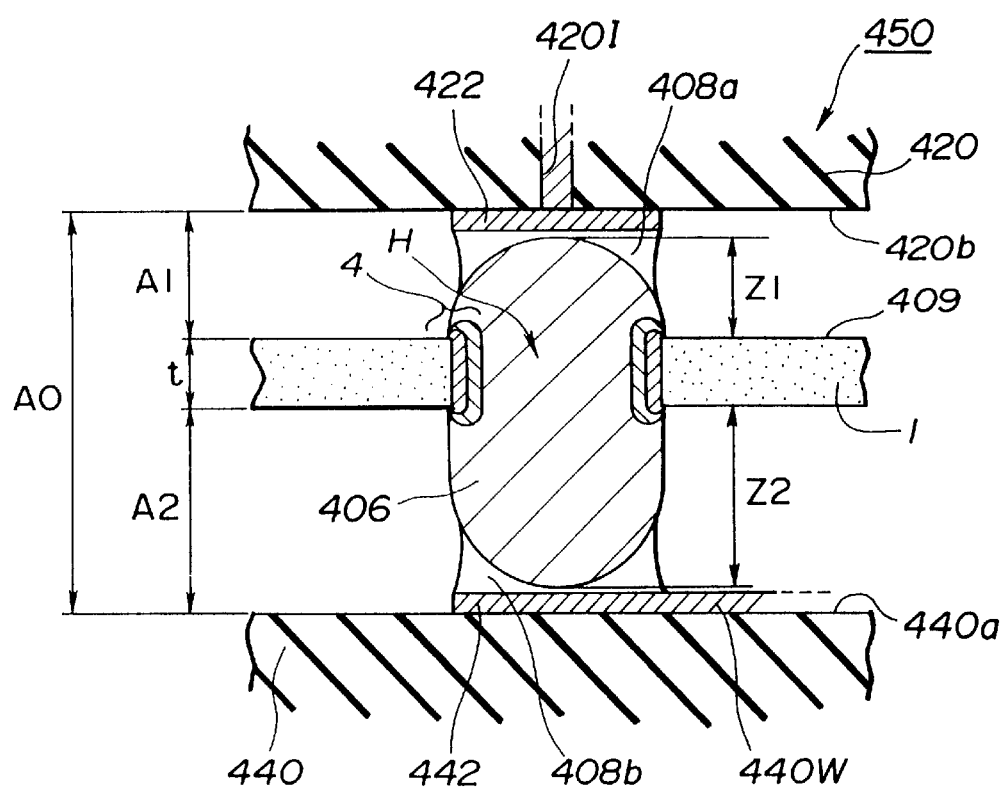
FIG. 19 is an enlarged fragmentary sectional view of the assembly used for evaluation of reliability.

Evaluation of bonding reliability was made with respect to an assembly 450 each consisting of a base plate, a connecting board and a mounting board as shown in FIG. 19, by preparing various assemblies 450 which differ in the space A1 between the base plate and the connecting board and the space A2 between the connecting board and the mounting board. egg. Samples used for evaluation are as follows. Each connecting board 409 has an connecting board substrate 1 made of alumina ceramic having a coefficient of thermal expansion αm of $7 \times 10^{-6}$ and having through holes H formed with metal layers 4 on the inner peripheral surfaces. The connecting board 409 further has soft metal bodies 406 made of Pb90—Sn10 high temperature solder. The connecting board substrate 1 is in the form of flat plate of 0.3 mm thick and 25 mm square. The inner diameter of the through hole H is 0.8 mm. Three hundred and sixty-one (361) through holes H are arranged at a pitch of 1.27 mm so as to form a grid pattern consisting of 19 vertical rows and 19 horizontal rows. An electroless Ni—B plated layer is formed on the tungsten base layer, and a thin electroless gold-plated layer is further formed thereon.

Each LGA type base plate 420 used as a base plate for evaluation is in the form of flat plate of 1.0 mm thick and 25 mm square. The LGA type base plate 420 is made of alumina ceramic having a coefficient of thermal expansion α1 of $7 \times 10^{-6}$ which is the same material as that of the connecting board substrate 1 and is provided on the lower surface 420b with pads (surface-bonding pads) 422 as external terminals. The pads 422 has a diameter of 0.86 mm and are arranged at a pitch of 1.27 mm so as to form a grid pattern consisting of 19 vertical rows and 19 horizontal rows so as to be aligned with the soft metal bodies. An electroless Ni—B plated layer is formed on each molybdenum base layer and a thin gold plated layer is further formed thereon to prevent oxidation.

Each printed circuit board 440 used as a mounting board for evaluation is made of glass epoxy resin (Japanese Industrial Standard: FR-4 having a coefficient of thermal expansion of $15 \times 16^{-6}$) and is in the form of a substantially rectangular plate of 1.6 mm thick, 230 mm long and 125 mm wide (i.e. 230 mm×125 mm). Pads 442 are formed on the main surface 440a of the printed circuit board 440 at the positions corresponding to the pads 422 of the LGA type base plate 420 as well as the soft metal bodies 406. The pads 442 are made of copper and has a thickness of 25 μm and a diameter of 72 mm. A group of pads is formed by arranging three hundred and sixty-one (361) pads 442 at a pitch of 1.27 mm so as to form a grid pattern consisting of 19 vertical rows and 19 horizontal rows. Eight groups of pads of such an arrangement are arranged so as to form a pattern consisting of two vertical rows and four horizontal rows so that eight base plates 420 are bonded to the pads 422 of the printed circuit board 440 at one time.

The LGA base plate 420, the connecting board 409 and the printed circuit board 440 are bonded together by means of low temperature solder layers 408a and 408b made of Pb37%—Sn63% eutectic solder to form an assembly 450. In the assembly 450, all the pads 422 form a daisy chain so that they are connected in series by internal wiring 420I provided in the base plate 420 and wiring 440W provided on the printed circuit board 440. Electrical conduction or disconnection of the assembly 450 were checked on both end of the daisy line. In other words, the assembly 450 was considered to be in an electrically conductive state when all pads 422 were conductive, whereas the assembly 450 was considered to be in an electrically disconnected state when any one or any ones of the pads 422 were broken.

In order to measure the average lives (MTBF) (times at which the pads were broken), cyclic cooling and heating tests were made at a temperature rage from −40° C. to 125° C. on the assemblies 450 having various protruding heights Z1 and Z2 of the soft metal bodies 406 on the first and second surface sides of the connecting board substrate 1, and various spaces A1 and A2 which were provided by the protruding heights Z1 and Z2. Thirty-two (32) assemblies were tested in order to obtain the results for each sample.

Each assembly of sample No. 4 had the second protruded portions shaped like pillar and formed by the method described in the third embodiment in order to enlarge the protruding height Z2.

Each assembly of sample No. 5 was a conventional assembly in which the base plate 420 and the printed circuit board 440 were bonded together without using the connecting board 409 and was used as a comparative sample. In this case, high temperature solder balls having a diameter of 0.9 mm and made of Pb90—Sn10 high temperature solder were used in place of the soft metal bodies of sample No. 4. Bonding were made by eutectic solder in the same way as in sample No. 4. The space A0 between the base plate and the printed circuit board was 1.0 mm. In each sample, the space A0 between the base plate and the printed circuit board is represented by A1+t+A2, t being the thickness of the connecting board substrate 1 which is 0.3 mm.

Figure 20:
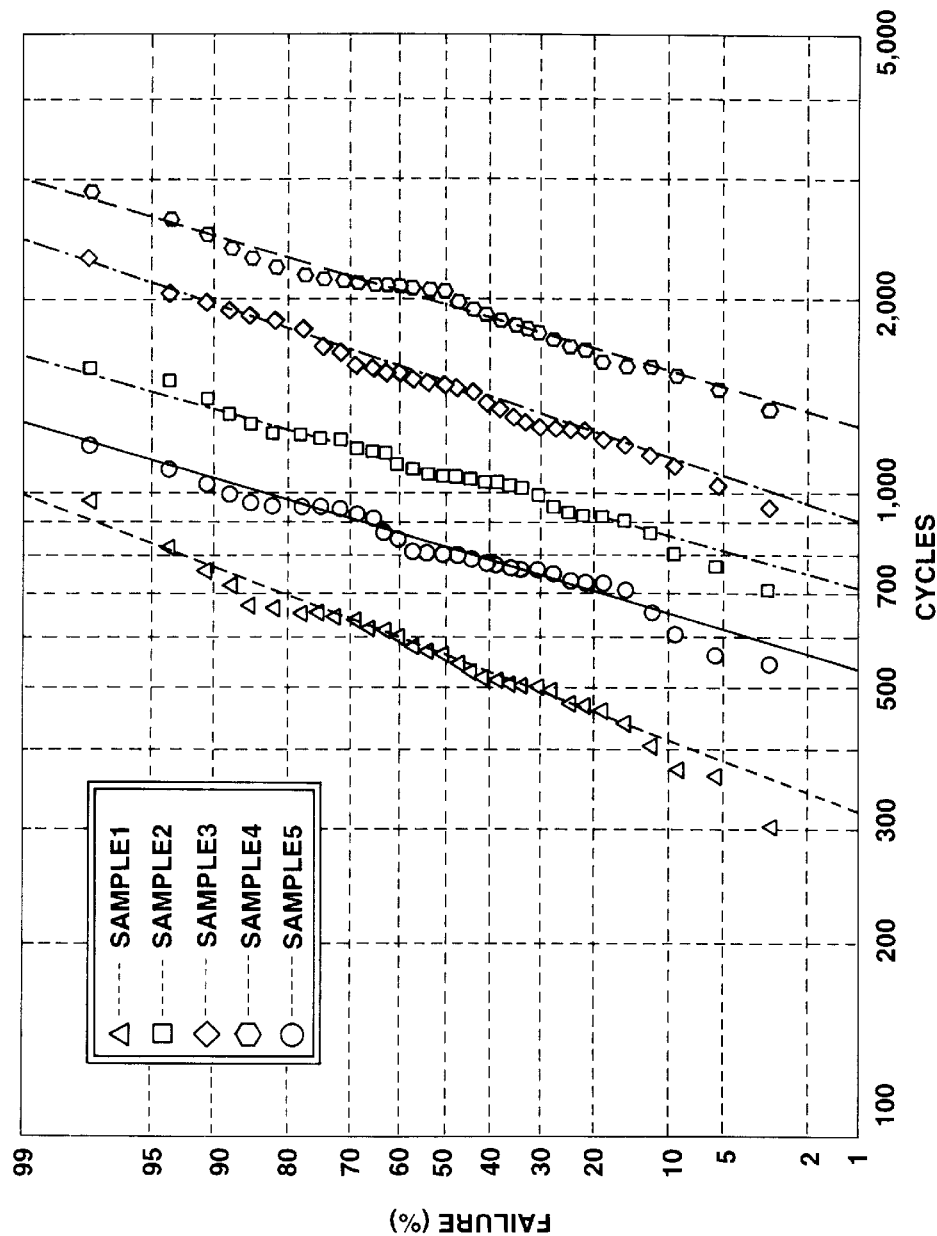
FIG. 20 is a graph showing failure ratio with respect to the cooling cycles.

The test result is shown in Table 1 and FIG. 20. The lives (MTBF values) were obtained from the gradients of normal logarithmic plots as shown in FIG. 20.

TABLE 1

| Sample | Protruding Heights (mm) | | Spaces (mm) | | | Life | |
|---|---|---|---|---|---|---|---|
| No. | Z1 | Z2 | A0 | A1 | A2 | (Cycles) | Mode |
| 1 | 0.03 | 0.70 | 1.07 | 0.05 | 0.72 | 1500 | c |
| 2 | 0.30 | 0.30 | 0.98 | 0.34 | 0.34 | 1050 | c |
| 3 | 0.70 | 0.03 | 1.07 | 0.72 | 0.05 | 570 | b |
| 4 | 0.01 | 1.75 | 2.11 | 0.03 | 1.78 | 1950 | c |
| 5 | — | — | 1.00 | — | — | 820 | a |

Notes:
The meaning of the signs in the modes is as follows:
a: The solder 408a disposed in the vicinity of the pads 422 of the base plate 420 was broken.
b: The solder 408b disposed in the vicinity of the pads 442 of the printed circuit board was broken.
c: The root portion at the second surface of the soft metal body 406 was broken.

As apparent from FIG. 20, the assembly using a connecting board in the case of sample No. 2, in which the spaces A1 and A2 were equal to each other, in other words in which the connecting board substrate 1 was disposed just at the central portion between the base plate 420 and the printed circuit board 440, had a longer life by about 1.3 times than the conventional assembly of sample No. 5 which did not use connecting board 409. When the connecting board 409 was disposed closer to base plate 420 than to the printed circuit board 440 as in the case of sample No. 1, the life of the assembly embodied in sample No. 1 was longer than 1.8 times than the conventional assembly of sample No. 5. In the case of sample No. 4 where the second protruded portions were formed into a pillar shape and the second protruding height Z2 and the space A2 were made large, the life of the assembly was longer by 2.3 times than the conventional assembly of sample No. 5. It was found that the life was shortened when the connecting board substrate 1 was disposed in the vicinity of the printed circuit board 440 as shown in sample No. 3.

The dimensional relationships between the protruding heights Z1 and Z2 and between the spaces A1 and A2 of sample No. 1 were reversed from those of sample No. 3. The life of sample No. 1 was longer than that of sample No. 3. From this result, it will be understood that the inherent bonding reliability cannot also be attained if an erroneous surface of the connecting board is selected. Thus, the provision of a mark for distinguishing the first and second surfaces from each other is proved to be desirable in order to prevent selection of an erroneous surface of the connecting board.

After the tests, it was checked what parts of the samples had been broken. Mode "a" shows that the solder 408a disposed in the vicinity of the pads 422 of the base plate was broken. Mode "b" indicates that the solder 408b disposed in the vicinity of the pads 442 of the printed circuit board was broken. Mode "c" denotes that the root portions at the side of the second surface (the root portions of the second protruded portions) were broken. These modes are indicated in Table 1.

The test result is as follows. Since the connecting board substrate 1 and the base plate 420 are made of substantially the same material, little difference in thermal expansion occurs therebetween and thus little stress is produced therebetween.

As, on the other hand, the material and the coefficient of thermal expansion of the connecting board substrate 1 (the board 420 in Sample No. 5) are different from those of the printed circuit board 440, the difference in thermal expansion occurs therebetween to produce stress in the shearing direction therebetween.

It is considered, therefore, that breakage occurred in sample No. 5, which did not use the connecting board 409, in Mode "a" in which the solder 408a in the vicinity of the pads was broken. The pads 422 are formed on the base plate 420 made of ceramic which is difficult to deform and are made of a relatively hard molybdenum-metallized material. Thus, the pads 422 on the base plate 420 hardly absorb the stress as compared with the deformable pads 442 of the printed circuit board 440. However, the pads 442 made of soft copper are formed on the printed circuit board 440 made of relatively deformable resin and thus absorb the stress easily. It is considered, therefore, that the solder 408a at the side of the base plate 420 was selectively broken.

In any of samples of from No. 1 to No. 4 which use the connecting boards 409, the breakage in Mode "a" type does not occur. Regardless of the size of the space A1, no stress is exerted on the portions in the vicinity of the pads 422 of the base plate 420 because there was no difference in thermal expansion between the base plate 420 and the connecting board substrate 1.

Instead, shearing stress is produced between the connecting board substrate 1 and the printed circuit board 440. However, much shearing stress is absorbed by the deformation of the second protruded portions of the soft metal bodies 406. This is understand from the experimental results in which sample No. 2 has a longer life (1050 cycles) than the life of sample No. 5 (850 cycles) in spite of the fact that the space A2 between the base plate and the connecting board, by which the space A0 between the base plate and the printed circuit board in sample 5 is replaced, is 0.34 mm which is less by about 34% than the space A0 of 1.0 mm of sample No. 5.

It is considered that this is because the soft metal bodies 406 were deformed to absorb the stress in the vicinity of their portions (the roots of the protruded portions) at which the soft metal bodies and the second surface of the connecting board intersected each other and the second protruded portions were inclined to be deformed to absorb the stress further. In particular, the greater the space A2 between the connecting board and the printed circuit board, the higher are formed the second protruded portions. Thus, this reasoning is well supported by the experimental results in which the life of the bonding is elongated in the order of samples Nos. 3, 2, 1 and 4.

Further, it is considered that the life of bonding is elongated most in sample No. 4 because the second protruded portions 406a have a pillar shape which can be deformed easily to absorb much stress.

On the contrary, if the space A2 is too narrow, the second protruded portions cannot absorb enough stress. Thus, breakage occurs in Mode "b" as in sample No. 3, resulting in a shorter life than that of the conventional case.

In the case where the material of the connecting board substrate 1 is changed from alumina ceramic to epoxy resin, the life can be prolonged by making the protruding height Z1 larger than the protruding height Z2 and by disposing the substrate 1 closer to the printed circuit board 440 in such a manner that the space A1 is made wider than the space A2 in contrast to the above-mentioned structures.

From the foregoing description, it will be understood that the life of bonding can be prolonged and bonding reliability can be enhanced by enlarging the height of the protruded portions and the space at the side at which larger stress is produced (the second protruding height Z2 for the alumina ceramic made-connecting board substrate 1 and the space A2).

In other words, the life of the assembly can be prolonged and the reliability can be improved by providing the protruded portions having different protruding heights Z1 and Z2 according to the materials and the coefficients of thermal expansion of the base plate and the connecting board. When the base plate and the connecting board substrate are made of substantially the same material or when the difference ($|\alpha 1-\alpha m|$) in the coefficients of thermal expansion between them is smaller than the difference ($|\alpha m-\alpha 2|$) in the coefficients of the connecting board and the printed circuit board, Z1 is made smaller than Z2 and A1 is made smaller than A2, thereby elongating the life of the assembly. Reversely, in case the difference ($|\alpha 1-\alpha m|$) in the coefficients of thermal expansion between the base plate and the connecting board is larger than the difference ($|\alpha m-\alpha 2|$) in the coefficients of the connecting board and the printed circuit board, Z1 is made larger than Z2 and A1 is also larger than A2, whereby the life of the assembly can be prolonged.

While the present invention has been described and shown as above, it is not for the purpose of limitation but various modifications and variations can be made thereto without departing from the scope of the present invention.

In the above-mentioned embodiments, the connecting board substrate 1 is made of alumina but need not to be limited thereto and may be made of aluminum nitride, silicon nitride, carbon nitride, mullite or other ceramic. In particular, as relatively high tension is applied to the connecting board substrate 1, it is preferred that the substrate 1 be made of a suitable material having high strength against breakage and/or high rigidity. The base plate and/or mounting board may be made of a suitable resinous material such as glass epoxy resin, BT resin or the like. It is particularly preferred that the base plate be made of a material of a resinous group because the base plate and the connecting board are made of similar materials which have substantially the same coefficient of thermal expansion.

The material of the base plate is not limited to alumina but can be another suitable ceramic such as aluminum nitride, silicon nitride, mullite, glass ceramic or the like. Alternately, the base plate may be made of a material of a resinous group such as glass epoxy resin, BT resin, glass BT resin and phenolic resin such as paper phenolic resin and/or epoxy resin. The base plate is not limited to the one on which integrated circuit chip or chips are mounted but may be such one on which other electronic parts such as active elements such as transistors, resistors and/or capacitors.

The mounting board is a mother board in the embodiments but may be a single board or a plurality of boards may be used.

In the above-mentioned embodiments, the jigs are made of carbon (black carbon), alumina or stainless steel which rejects the molten soft metal and/or the molten solder. However, their material may be such one which has a good heat resistance and is unwettable to the molten metal such as carbon, boron nitride, silicon nitride, ceramic such as alumina, or a steel such as stainless steel or titan.

The transfer plate, the solder holding Jig and the ball control plate are plate members. It is convenient, go therefore, that the they are made of metal such as stainless steel because metal plates are not broken easily and through holes are accurately and easily formed in the plates by means of an etching process. In order to reduce the coefficient of the thermal expansion of these elements and to prevent their bending, ceramic can be used.

What to claimed is:

1. A connecting board interposed between a base plate having a plurality surface-bonding pads and a mounting board having a plurality of surface-bonding and mounting pads at corresponding positions to the surface-bonding pads of the base plate, for connection of the base plate and the mounting board through connection at the surface-bonding pads located on the side of a first surface of the connecting board and at the surface-bonding and mounting pads located on the side of a second surface of the connecting board, the connecting board comprising:

a substrate in the form of a flat plate, having said first surface and said second surface and a plurality of through holes extending between said first and second surfaces;

said substrate being made of a ceramic material; and a plurality of soft metal bodies mounted in said through holes, respectively, each of said soft metal bodies having a first protruded portion protruding from one of said first and second surfaces and a second protruded portion protruding from the other of said first and second surfaces, said first protruded portion and said second protruded portion being different in height from each other;

wherein said first protruded portion of each of said soft metal bodies is in the form of a pillar and of such a height above one of said first and second surfaces that is larger than the maximum diameter of a cross section of said pillar, and wherein a metal layer is formed on an inner circumferential surface of each of said through holes, and said metal layer is welded onto each of said soft metal bodies.

2. A connecting board interposed between a base plate having a plurality surface-bonding pads and a mounting board having a plurality of surface-bonding and mounting pads at corresponding positions to the surface-bonding pads of the base plate, for connection of the base plate and the mounting board through connection at the surface-bonding pads located on the side of a first surface of the connecting board and at the surface-bonding and mounting pads located on the side of a second surface of the connecting board, the connecting board comprising:

a substrate in the form of a flat plate, having said first surface and said second surface and a plurality of through holes extending between said first and second surfaces;

said substrate being made of a ceramic material; and a plurality of soft metal bodies mounted in said through holes, respectively, each of said soft metal bodies having a first protruded portion protruding from one of said first and second surfaces and a second protruded portion protruding from the other of said first and second surfaces, said first protruded portion and said second protruded portion being different in height from each other;

wherein said first protruded portion of each of said soft metal bodies is in the form of a pillar and of such a height above one of said first and second surfaces that is larger than the maximum diameter of a cross section of said pillar, and wherein there is further provided a first mark for identifying said first surface and second mark for identifying said second surface.

3. The connecting board according to claim 2, wherein said second mark is provided so as to be observable from said second surface and first mark is provided so as to be observable from said first space.

4. A connecting board interposed between a base plate having a plurality of surface-bonding pads and a mounting board having a plurality of surface-bonding and mounting pads at corresponding positions to the surface bonding pads of the base plate, for connection of the base plate and the mounting board through connection at the surface-bonding pads located on the side of a first surface of the connecting board and at the surface-bonding and mounting pads located on the side of a second surface of the connecting board, the connecting board comprising:

a substrate in the form of a flat plate, having said first surface and said second surface and a plurality of through holes extending between said first and second surfaces and in an in-line axial alignment with the surface-bonding pads of the base plate and the surface-bonding and mounting pads of the mounting board respectively;

said substrate being made of a ceramic material;

a plurality of soft metal bodies mounted in said through holes, respectively, each of said soft metal bodies having a protruded portion protruding from one of said first and second surfaces;

a plurality of first solder layers, each of which is disposed on a surface portion of each of said soft metal bodies, said first solder layers being located on the side of said first surface of said substrate; and a plurality of second solder layers, each of which is disposed on a surface portion of each of said soft metal bodies, said second solder layers being located on, the side of said second surface of said substrate;

wherein said protruded portion of each of said soft metal bodies is in the form of a pillar and of such a height above one of said first and second surfaces that is larger than the maximum diameter of said pillar; and wherein said soft metal bodies and said first and second solder layers consist of solders that are different in melting point, respectively, said soft metal bodies are made of one of said solders higher in melting point and said first and second solder layers are made of the other of said solders lower in melting point.

* * * * *